United States Patent [19]
Kataoka et al.

[11] Patent Number: 5,298,485
[45] Date of Patent: Mar. 29, 1994

[54] SUPERCONDUCTIVE LOGIC DEVICE

[75] Inventors: Shoei Kataoka, Tokyo, Japan; Hiroya Sato, Watertown, Mass.; Shuhei Tsuchimoto, Nara, Japan; Hideo Nojima, Nara, Japan; Shinji Toyoyama, Nara, Japan; Masayoshi Koba, Nara, Japan; Nobuo Hashizume, Nara, Japan; Eizo Ohno, Nara, Japan; Susumu Saitoh, Nara, Japan

[73] Assignee: Sharp Kabushiki Kaisha, Osaka, Japan

[21] Appl. No.: 983,290

[22] Filed: Nov. 30, 1992

Related U.S. Application Data

[63] Continuation of Ser. No. 821,284, Jan. 10, 1992, abandoned, which is a continuation of Ser. No. 559,375, Jul. 26, 1990, abandoned, which is a continuation of Ser. No. 309,228, Feb. 10, 1989, abandoned.

[30] Foreign Application Priority Data

| Feb. 10, 1988 | [JP] | Japan | 63-29526 |
| Mar. 31, 1988 | [JP] | Japan | 63-81993 |
| Apr. 30, 1988 | [JP] | Japan | 63-108773 |
| May 13, 1988 | [JP] | Japan | 63-117471 |
| May 31, 1988 | [JP] | Japan | 63-134794 |
| May 31, 1988 | [JP] | Japan | 63-134797 |
| May 31, 1988 | [JP] | Japan | 63-134798 |
| Aug. 12, 1988 | [JP] | Japan | 63-202351 |

[51] Int. Cl.$^5$ .................. H03K 19/195; H03K 17/92
[52] U.S. Cl. .......................... 505/1; 307/462; 307/245; 307/306; 505/858; 505/860; 257/31
[58] Field of Search ........... 307/462, 476, 245, 277, 307/306; 357/5; 505/859, 860, 862, 863, 858

[56] References Cited

U.S. PATENT DOCUMENTS

| 2,938,160 | 5/1960 | Steele | 307/306 |
| 3,076,102 | 1/1963 | Newhouse et al. | 505/860 |
| 3,093,754 | 6/1963 | Mann | 307/306 |
| 3,106,648 | 10/1963 | McMahon et al. | |
| 3,145,310 | 8/1964 | Bertuch et al. | |
| 3,171,035 | 2/1965 | Clauser | 307/476 |
| 3,182,275 | 5/1965 | Newhouse et al. | 338/32 |
| 3,255,362 | 6/1966 | Stowell | 307/462 |
| 3,351,774 | 11/1967 | Porter | |
| 3,365,584 | 1/1968 | Bragg | 307/476 |
| 3,369,127 | 2/1968 | Kaufman et al. | 307/306 |
| 3,398,299 | 8/1968 | Walker et al. | 505/862 |
| 4,097,765 | 6/1978 | Zappe | 307/462 |
| 4,316,785 | 2/1982 | Suzuki et al. | |

FOREIGN PATENT DOCUMENTS

| 1167386 | 4/1964 | Fed. Rep. of Germany . |
| 1282078 | 11/1968 | Fed. Rep. of Germany . |
| 3815183 | 3/1989 | Fed. Rep. of Germany . |
| 2469005 | 5/1981 | France . |
| 60-65582 | 4/1985 | Japan . |
| 1006831 | 10/1965 | United Kingdom . |
| 1023868 | 3/1966 | United Kingdom . |

OTHER PUBLICATIONS

"Josephson Not Circuit" D. J. Herrell et al., IBM Tech. Disc. Bull. vol. 15 No. 5 Oct. 1972 p. 1527.
A. Davidson, "Complementary Single Rail Logic" IBM Tech. Disc. Bull. vol. 20 No. 10 Mar., 1978 pp. 4190–4193.
Nojima et al. "Galvanomagnetic Effect . . . " in Japanese Journal of Applied Physics, vol. 27, #5, 1988 pp. 746–750.
Kita et al. "Highly Sensitive Magnetic" in 5th International Workshop, Jun. 2–4, 1988, pp. 231–234.
Tsuchimoto et al. "Novel Magnetic Sensor" in IEEE, Dec. 8, 1987, pp. 867–868.
Superconducting Upper Critical Field $H_{c2}$ of High-$T_c$ Y-Ba-Cu-O Compound System Japanese Journal of Applied Physics, vol. 26, No. 5, May, 1987 pp. L668–L670.

Primary Examiner—John Zazworsky

[57] ABSTRACT

A logic circuit device includes a superconductive body formed of a ceramic superconductive material. The ceramic superconductive material has random grain boundaries which act as weak couplings. The ceramic superconductive material also has a magneto-resistive property. There is at least one conductor arranged near the ceramic superconductive body in order to exert a magnetic field on the ceramic superconductive body. The ceramic superconductive body changes its resistance in response to the magnetic field generated by the conductor. The ceramic superconductive body can be used as part of a logic circuit.

17 Claims, 20 Drawing Sheets

SUPERCONDUCTIVE LOGIC DEVICE

This application is a continuation of application Ser. No. 07/821,284 filed Jan. 10, 1992 which is a continuation application of Ser. No. 07/559,375 filed on Jul. 26, 1990 which is a continuation application of Ser. No. 07/309,228, filed Feb. 10, 1989, all now abandoned.

BACKGROUND OF THE INVENTION

1. Field of the Invention

The present invention relates to logic circuit device using at least one superconductor material.

2. Description of Prior Art

A Josephson device is well known as a logic circuit device which uses a superconductor and it has a layered structure so an extremely thin insulation film is sandwiched between superconductors made of a Nb or Pb alloy.

However, it becomes necessary to make the thickness of the insulation film thin to an order of 10 Ås in order to obtain an effective Josephson devices since a very high technique for manufacturing the thin film is needed.

Although Josephson device has a technical advantage in that it shows a very quick response, it is not advantageous for practical use since a change in the output level thereof is small.

SUMMARY OF THE INVENTION

An object of the present invention is to provide a superconductive logic device of high performance which is easy to manufacture.

Another object of the present invention is to provide a superconductive logic device of high performance which is able to function as either one of the fundamental logic circuits such as AND, NAND, OR, EX-OR and NOR logic circuits.

A further object of the present invention is to provide a superconductive logic device of high performance which is able to respond to at least two input signals.

One more object of the present invention is to provide a logic circuit using at least two superconductive logic devices according to the present invention.

In order to achieve these objects, according to the present invention, there is provided a logic circuit.

The logic circuit has superconductive body made of a ceramic material which is connected to a power supply for applying a constant current to the superconductive body having a magneto-resistive property which is related to a field applied to its while keeping the body at a temperature near to the critical temperature thereof.

A conductor means is arranged near the superconductive body and electrically isolated therefrom. The conductor means is used to apply a magnetic field to said superconductive body when a signal current is applied to said conductor means. The superconductive body generates an output voltage in response to the signal current.

The superconductive body used in the present invention is made of a ceramic superconductive material which has grain boundaries therein. These grain boundaries are considered to form various weak couplings including point contacts, tunnel couplings and the like and, accordingly, the superconductive body shows a magneto-resistive property by applying a magnetic field thereto while applying a constant current thereto.

The in present invention, this magneto-resistive property of a ceramic superconductor is effectively utilized. Namely, the superconductive body responds to a magnetic field generated by a current applied to the conductor means by generating a resistance therein if the magnetic field applied thereto is stranger than a threshold magnetic field which is determined in accordance with the magneto-resistive property thereof and the strength of the current to be applied thereto.

As shown as an example of the magneto-resistive property of a ceramic superconductor in FIG. 4, the resistance generated therein increases steeply as the magnetic field increases larger than the threshold magnetic field.

Thus, the superconductive body according to the present invention has a high sensitivity and a quick response to the magnetic field applied thereto. This guarantees a high performance of the superconductive logic device according to the present invention.

According to another aspect of the present invention, there is provided a logic circuit which includes:

a superconductive body made of a ceramic material which is connected to a power supply for applying a constant current thereto. The superconductive body shows a magneto-resistive property in accordance with a magnetic field applied thereto while keeping the body at a temperature near to the critical temperature thereof.

A first conductor means is arranged near the superconductive body and electrically isolated therefrom. The first conductor means is used for applying a magnetic field to the superconductive body when a current is applied to said first conductor means.

A second conductor means is arranged near the superconductive body and electrically isolated from both of said superconductive body and said first conductor means. The second conductor means is used for applying a magnetic field to said superconductive body when a current is applied to said second conductor means.

Accordingly with the structure described above said superconductive body generates a response in accordance with a manner of application of said signal currents to said first and second conductor means.

In this superconductive logic circuit, the superconductive body is able to respond according to a manner of application of the currents to be applied to respective conductor means. Thus, a variety of fundamental logic circuits can be obtained by controlling the currents and their strengths.

The difference in temperature when the resistance of the material that can act as a superconductor starts to fall and the temperature when no more resistance can be measured is known as the width or range phase of transition of a superconductive material.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENT

Figure 1:
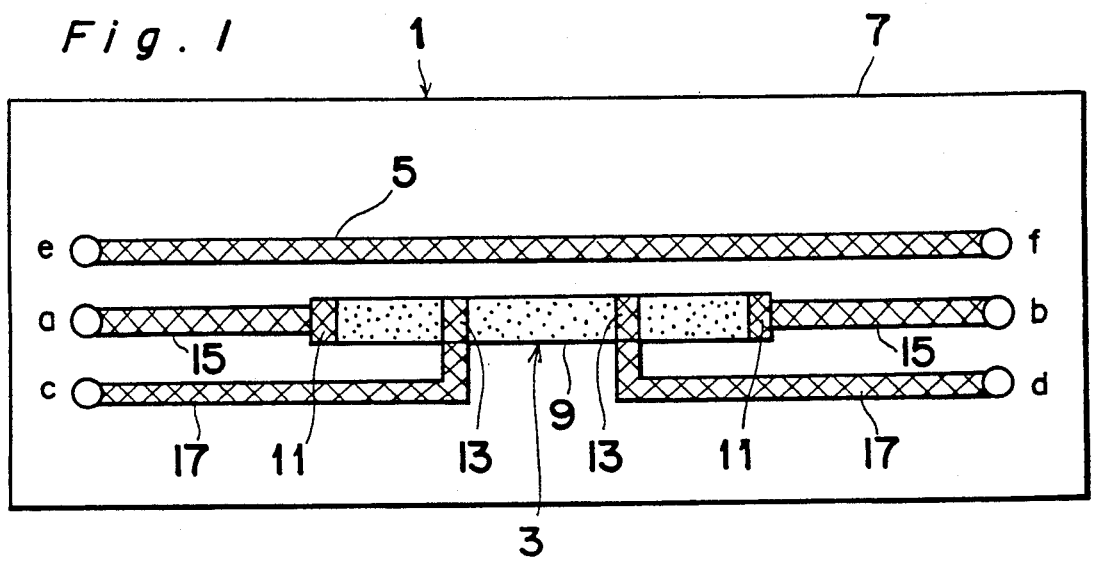
FIG. 1 is a plan view of a superconductive logic device according to a first preferred embodiment of the present invention.

FIG. 1 shows a plan view of a superconductive logic device according to a first preferred embodiment of the present invention.

The superconductive logic device 1 is comprised of a superconductive magnetic sensor 3 and a linear conductor 5 formed in parallel with the lengthwise direction of the magnetic sensor 3. The magnetic sensor 3 and the linear conductor 5 are formed on an insulation substrate 7.

The magnetic sensor 3 is comprised of a magneto-resistive superconductor 9 of an elongated rectangular plate configuration, a pair of current electrodes 11 and 11 formed at respective ends of the superconductor 9 and a pair of voltage electrodes 13 and 13 formed in between the pair of current electrodes 11 and 11 on the superconductor 9.

Each of lead lines 15 and 15 of the current electrodes 11 and 11 is formed on the substrate 7 so as to extend in parallel with the linear conductor 5 and each of lead lines 17 and 17 of the voltage electrodes 13 and 13 is also formed extended in parallel with the linear conductor 5, a shown in FIG. 1.

Figure 2:
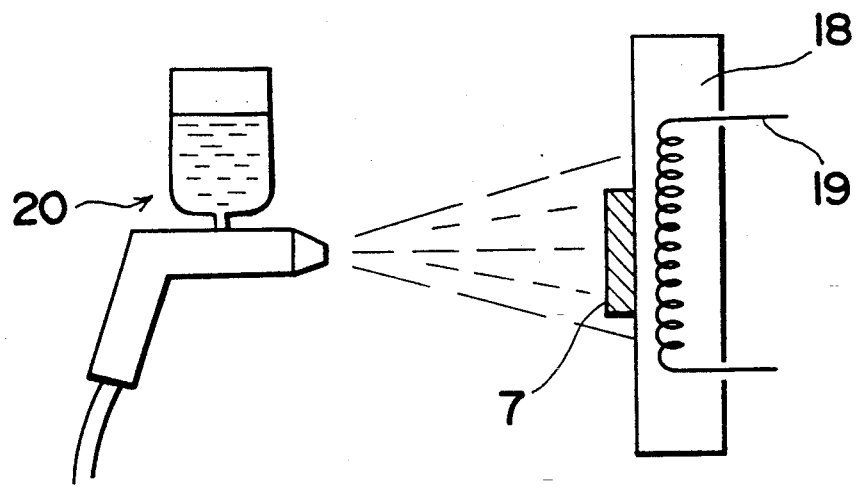
FIG. 2 is an explanatory view for showing a method for forming a superconductive body to be used in the superconductive logic device according to the present invention.

Before starting an explanation of actions of the superconductive logic device 1, a manufacturing method of the magneto-resistive superconductor 9 is explained referring to FIG. 2 showing a manufacturing apparatus therefor.

A substrate 7 desirably made of stabilized zirconia is supported on a base plate 18 and heated at a temperature of about 400° C. by a heater 19. Solvent of nitrate containing a ceramic material is sprayed onto the substrate 7 by a spray gun 20 intermittently. The ceramic material is a mixture of $Y(NO_3)_3 \cdot 6H_2O$, $Ba(NO_3)_2$, $Cu(NO_3)_2 \cdot 3H_2O$ which are weighed so as to have a composition of $Y_1Ba_2Cu_3O_{7-x}$ ($0 < > < 1$).

The spray operation is continued until the thickness of a film formed on the substrate 7 becomes 5μms. Then, the film obtained is sintered at 950° C. for 60 minutes and, thereafter, annealed at 500° C. for 10 hours. The ceramic superconductive film thus formed has such a property that the resistance thereof begins to decrease at 100 K and becomes zero at 83 K.

Next, a resist is applied on the ceramic superconductive film and a superconductor 9 is formed by the photolithographic method using an etchant of phosphoric acid so as to have a configuration of 50 μms width and 30 mms length.

Thereafter, Ti, a normal metal film is deposited on the substrate 7 and the superconductor 9 and, then, the linear conductor 5, electrodes 11, 11, 13 and 13 and lead lines 15, 15, 17 and 17 are formed using the photolithographic technique and the lift off method. Thus, the superconductive logic device 1 as shown in FIG. 1 is obtained.

Figure 3:
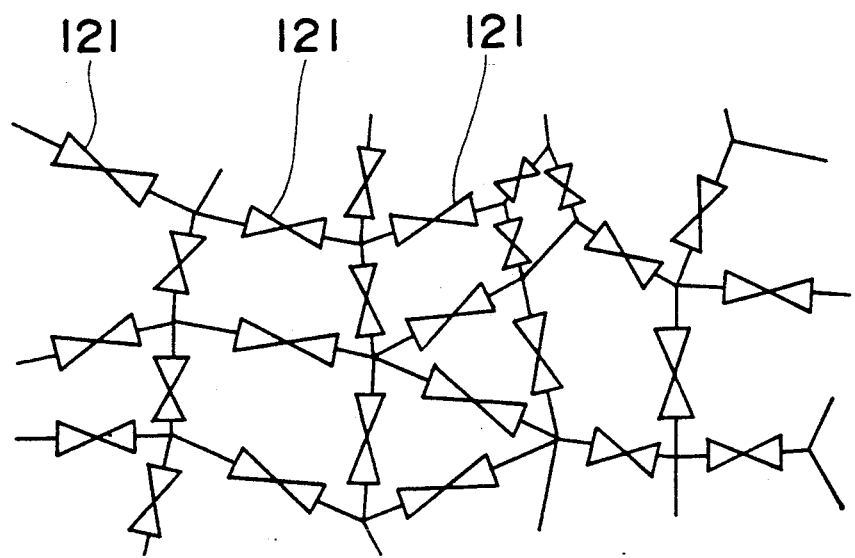
FIG. 3 is an explanatory view for showing a circuit equivalent to a circuit to be formed by grain boundaries in the superconductive body which acts as weak couplings.

The ceramic superconductor thus obtained has random grain boundaries supposed to act as weak couplings including point contacts and tunnel junctions therein and, therefore, it forms a collective body of Josephson junctions 121, as shown in FIG. 3.

Figure 4:
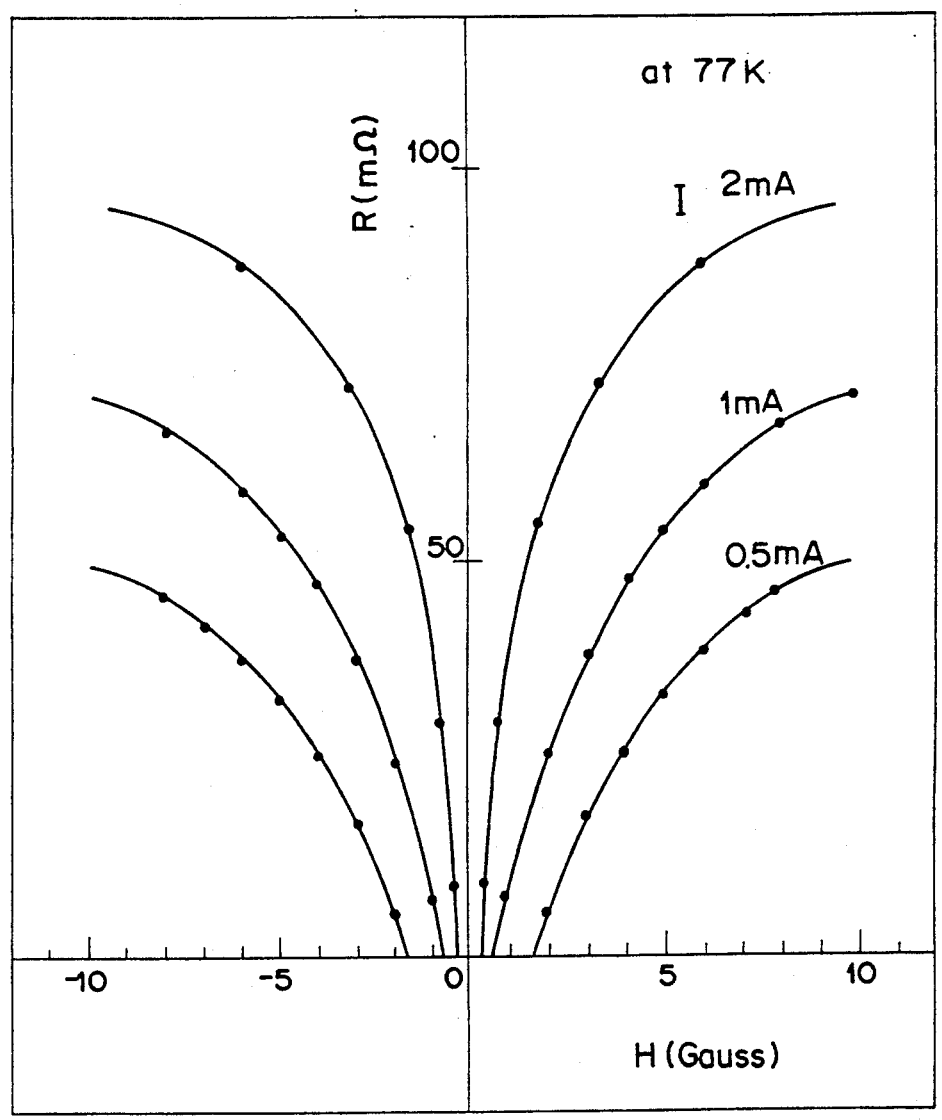
FIG. 4 is a graph showing a magneto-resistive property of the superconductive body.

In fact, the ceramic superconductor shows magnetoresistive property as shown in FIG. 4. Namely, the resistance thereof appears suddenly in accordance with an increase of a magnetic filed applied thereto in the state that an electric current is fed between the current electrodes 11 and 11. It is also to be noted that the resistance increases steeply with the increases of the applied magnetic field. Further, it is to be noted that the threshold value of the magnetic field from which the resistance begins to appear can be controlled by the strength of a current to be applied to the ceramic superconductor 3 as clearly shown in FIG. 4.

If a current of 20 mAs is fed to the linear conductor 5 via terminals e and f thereof, a magnetic field of 0.4 gausses is generated at a position apart from the linear conductor 5 by 50 μms. Assuming that the distance between the linear conductor 5 and the magnetic sensor 3 is 50 μms and a constant current of 2 mAs is supplied to the latter via terminals a and b thereof, an output voltage of 20 μVs is obtained between terminals c and d of the pair of voltage electrodes 13 and 13.

From these data, the linear conductor 5 is formed as a pattern of 30 μms width, 1 μms thickness and 50 μms distance defined between centers of the linear conductor 5 and the magnetic sensor 3.

According to the composition of the superconductive logic device 1, if a current I of 12 mAs is applied to the conductor 5 while keeping the temperature of the magnetic sensor 3 at a temperature equal to or lower than the critical temperature 83 K and applying the constant current of 2 mAs to the same, the magnetic sensor 3 outputs a voltage V of 20 μVs between the terminals c and d. The rising time of the voltage is about 0.5 picoseconds and, therefore, is neglectable.

If the current I is not applied to the conductor 5, no output voltage is generated in the magnetic sensor 3 since no magnetic field is applied to the same.

Figure 5:
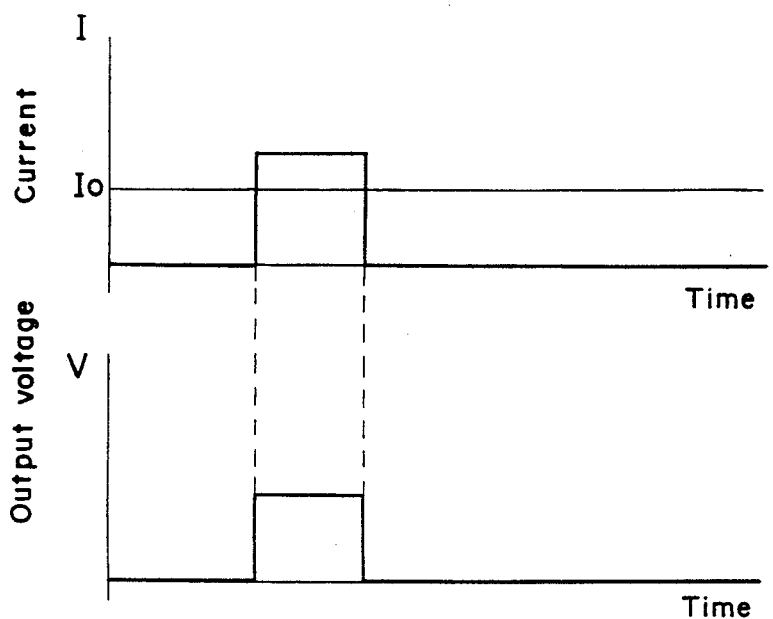
FIG. 5 is a time chart showing an output voltage obtained by the superconductive logic device according to the first preferred embodiment.

Thus, the superconductive logic device 1 shows a quick and clear response against the current I to be applied to the linear conductor 5, as shown in FIG. 5.

Figure 6:
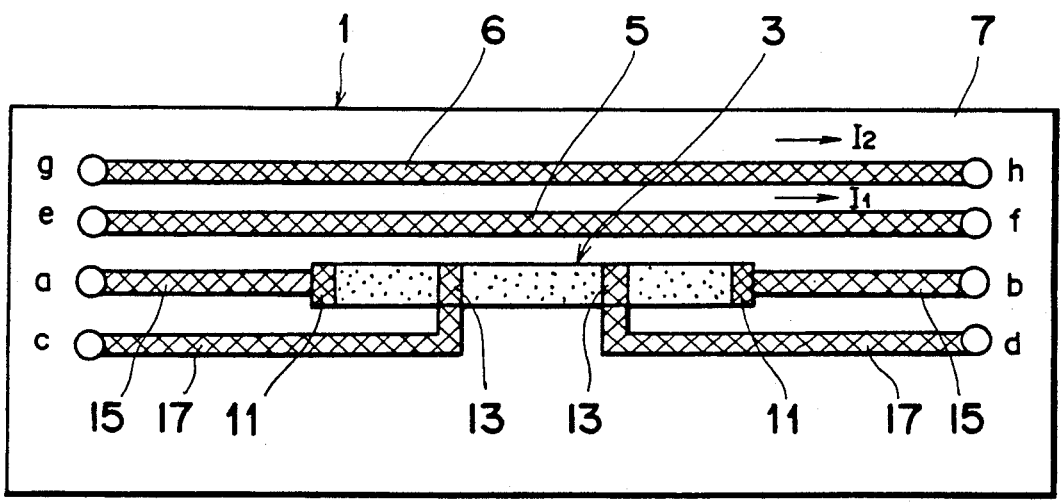
FIG. 6 is a plan view of another superconductive logic device according to the first preferred embodiment of the present invention.

FIG. 6 shows another superconductive logic device. As is apparent from comparison of FIG. 6 with FIG. 1, this superconductive logic device 1 has one more linear conductor 6 extending in parallel with the linear conductor 5 on the substrate 7.

In this case, a distance between centers of the magnetic sensor 3 and the first conductor 5 and that between centers of the first and second conductors 5 and 6 are set at 50 μms, respectively, and widths of these three elements are set at 50 μms, 30 μms and 30 μms, respectively.

In this structure of the superconductive logic device, an output voltage of 20 μVs is obtained by the magnetic sensor 3 when a current of 20mAs is applied only to the second conductor 6 while applying a current of 2mAs to the magnetic sensor 3.

According to this structure, it becomes possible to operate the superconductive logic device 1 as both of an AND logic device and an OR logic device by controlling strengths and directions of currents $I_1$ and $I_2$ to be applied to the first and second linear conductors 5 and 6.

In order to operate it as an AND logic device, currents $I_1$ and $I_2$ satisfying the following conditions are applied to the first and second linear conductors 5 and 6 in the same direction, respectively.

$$H_1 - H_0, H_2 < H_0, H_1 + H_2 > H_0 \quad (1)$$

wherein $H_0$ is a threshold magnetic field from which a resistance appears in the superconductor 9 to which a constant current is applied; $H_1$ is a magnetic field applied to the magnetic sensor 3 by applying the current $I_1$ to the first linear conductor 5 and $H_2$ is a magnetic field applied to the sensor 3 by applying the current $I_2$ to the second linear conductor 6.

As is apparent from the above conditions, no output is obtained by the magnetic sensor 3 when either one of the first and second currents $I_1$ and $I_2$ is applied to, since the magnetic field generated and applied to the magnetic sensor thereby is weaker than the threshold $H_0$. However, when both of the first and second currents $I_1$ and $I_2$ are applied to the first and second linear conductors 5 and 6 from the same direction at the same time, the magnetic sensor 3 outputs an output voltage since a resistance is generated in the superconductor 9 by the magnetic field ($H_1 + H_2$) applied thereto.

Figure 7:
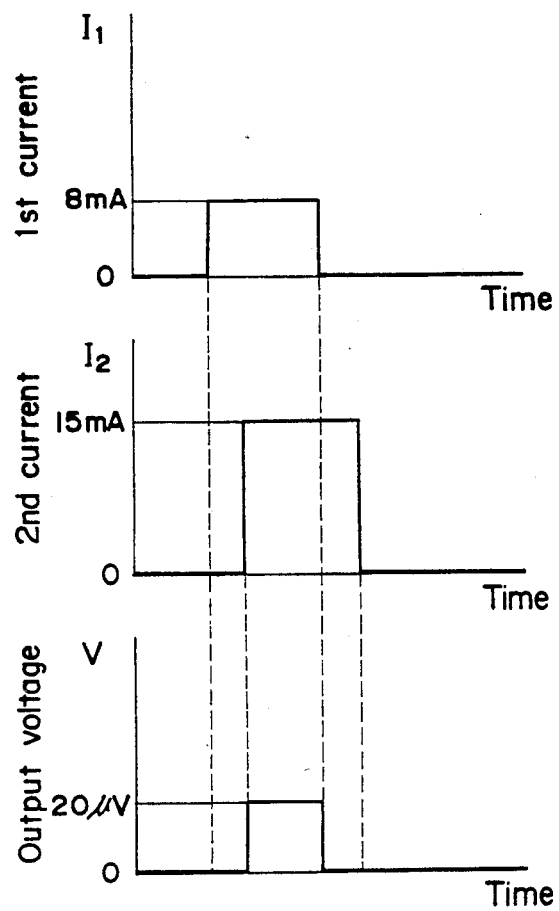
FIG. 7 is a time chart showing a function of the superconductive logic device shown in FIG. 6.

As shown in FIG. 7, in this example, an output voltage larger than 20 μVs is obtained as an AND logic output by setting $I_1$ and $I_2$ at 8 mAs and 15 mAs, respectively.

Figure 8:
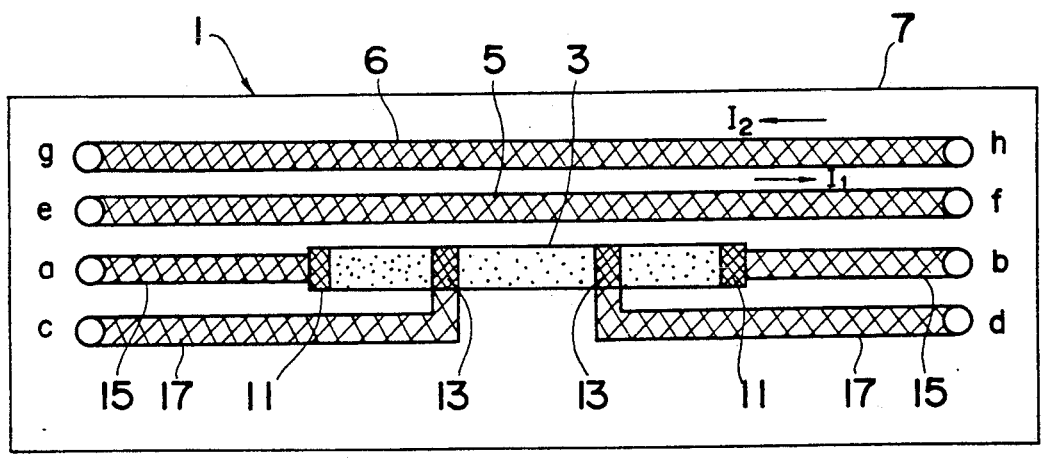
FIG. 8 is a plan view for showing another method for applying currents to first and second control lines of the superconductive logic device shown in FIG. 6.

On the other hand, if the first and second currents $I_1$ and $I_2$ satisfying the following conditions are applied to the first and second conductors 5 and 6 in opposite directions with each other, as shown in FIG. 8, the superconductive magnetic sensor functions as an EX-OR logic device.

$$H_1 > H_0, H_2 > H_0, |H_1 - H_2| < H_0 \quad (2)$$

wherein each of magnetic fields $H_0$, $H_1$ and $H_2$ is defined in the same manner as of the conditions (1).

Figure 9:
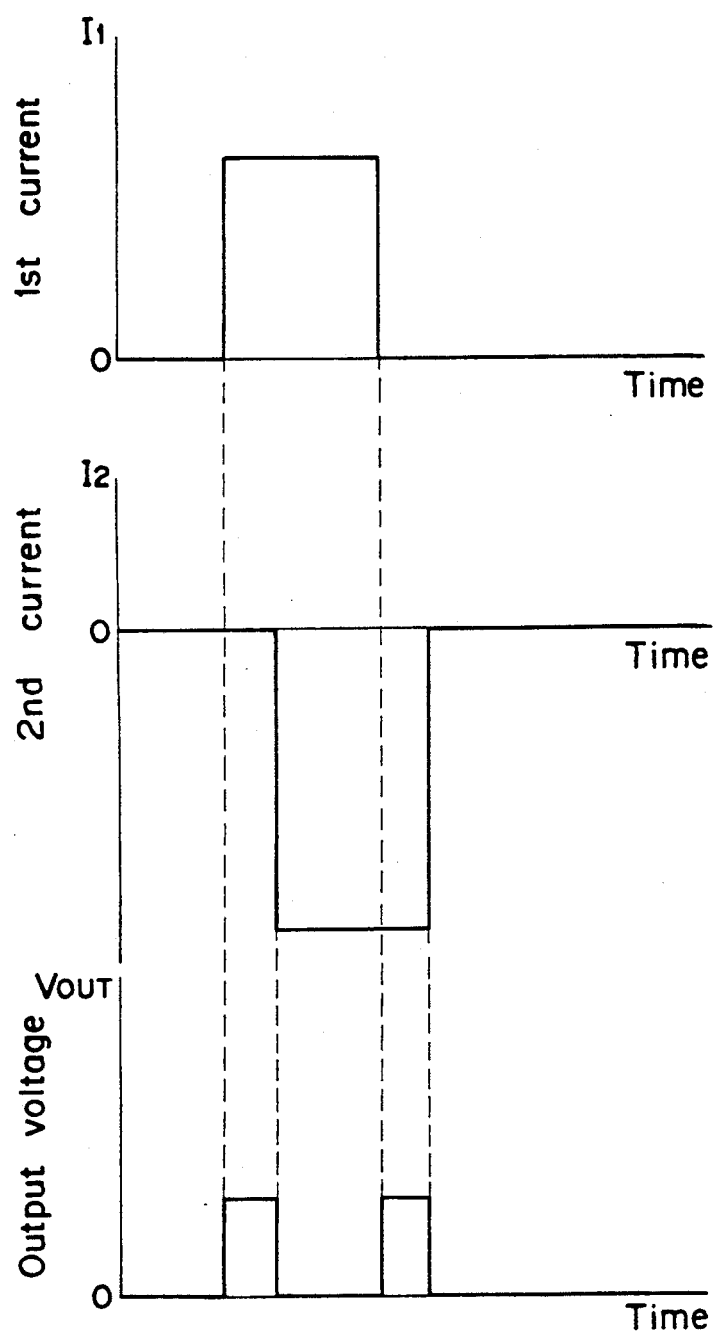
FIG. 9 is a time chart showing a function of the superconductive logic device shown in FIG. 8.

As is apparent from these conditions (2), the magnetic sensor 3 outputs an exclusive OR logic output only when either of the first and second currents $I_1$ and $I_2$ is applied to, as shown in FIG. 9.

Through the first and second current $I_1$ and $I_2$ are determined to have different values for satisfying the conditions in this example, the conditions can be satisfied by adjusting distances among the first and second conductors 5 and 6 and the magnetic sensor 3 while keeping the first and second currents $I_1$ and $I_2$ at a constant value.

The pattern layout for the magnetic sensor 3 and the first and second conductors 5 and 6 is not limited to that of the present preferred embodiment.

Figure 10:
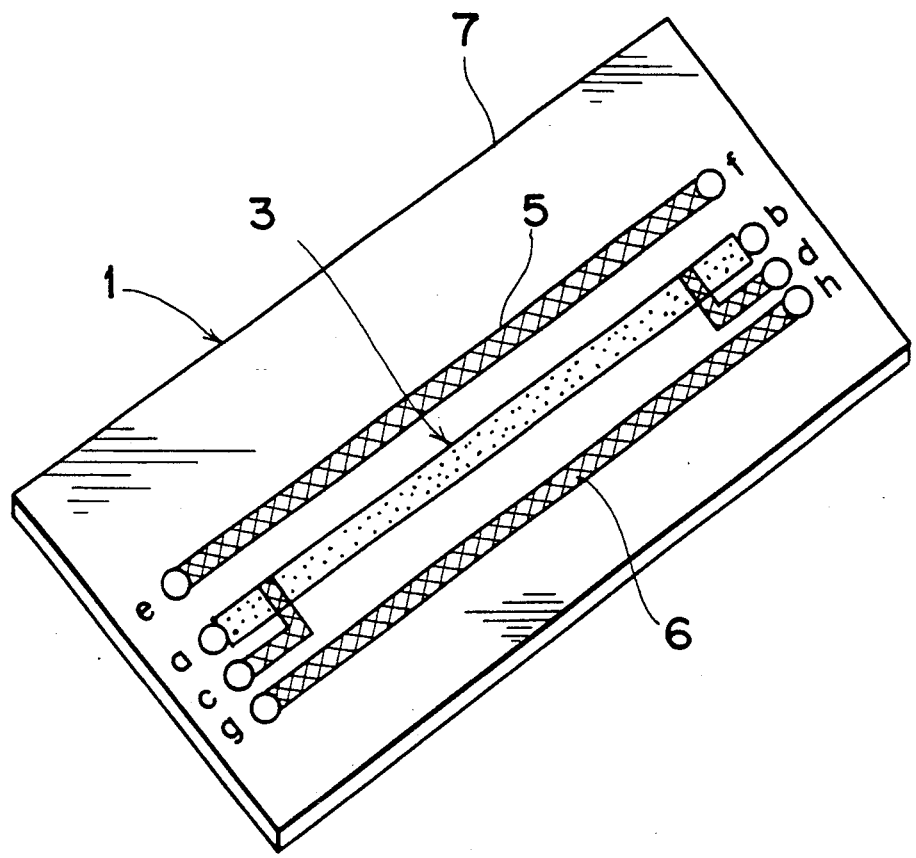
FIG. 10 is a perspective view showing one more superconductive logic device according to the first preferred embodiment of the present invention.

For example, as shown schematically in FIG. 10, the first and second linear conductors 5 and 6 can be arranged on both sides of the magnetic sensor 3, respectively.

Further, they can be arranged on a protection film of polyimido resin, $SiO_2$ or the like which is formed on the magnetic sensor 3 to cover the same although they are not shown.

Figure 11A:
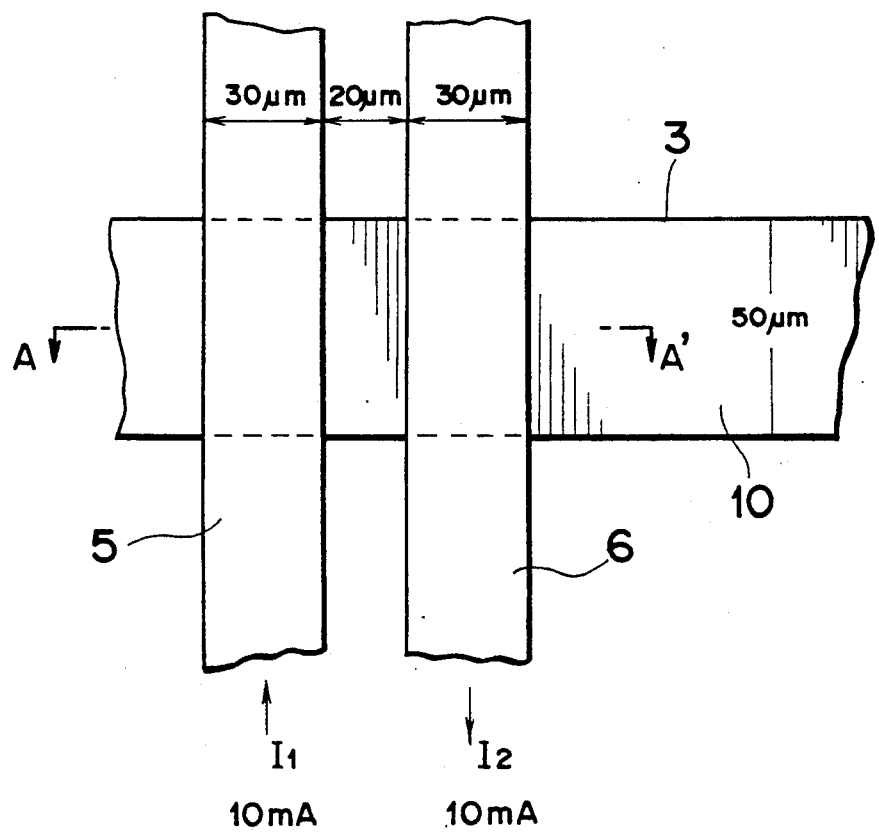
FIG. 11(a) is a partial plan view of a further superconductive logic device according to the first preferred embodiment of the present invention.
Figure 11B:
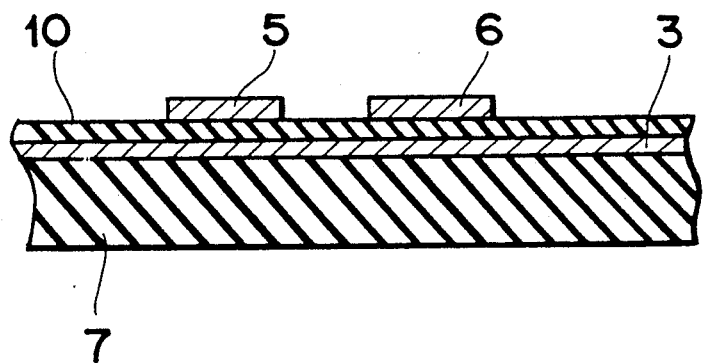
FIG. 11(b) is a cross-sectional view along A—A' line of FIG. 11(a)

In an example shown in FIGS. 11(a) and 11(b), a protective film 10 of polyimide, $SiO_2$ or the like is formed on the magnetic sensor 3 and two linear conductors 5 and 6 are formed so as to cross the magnetic sensor 3 perpendicularly.

In this case, the magnetic sensor 3 can output various logic outputs by controlling respective currents to be applied to the first and second linear electrodes 5 and 6.

It is to be noted that the conductors 5 and 6 and the ceramic superconductor 9 can be formed by a film of a ceramic superconductive material using the sputtering method, the MOCVD, the electron beam method or the like. These methods give such a possibility that patterns of the above mentioned elements can be made finely. It is also possible to make the conductors 5 and 6 using a superconductive ceramic material used for the magnetic sensor 3. In this case, the manufacturing process can be simplified since the conductors 5 and 6 are formed together with the superconductor 9 for the magnetic sensor 3.

Figure 12A:
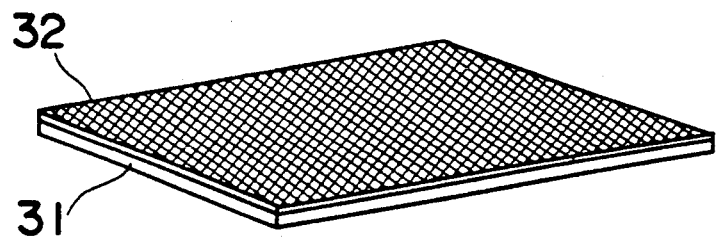
FIGS. 12(a) and 12(b) are perspective views showing a method for forming a superconductive logic device according to the first preferred embodiment of the present invention.
Figure 12B:
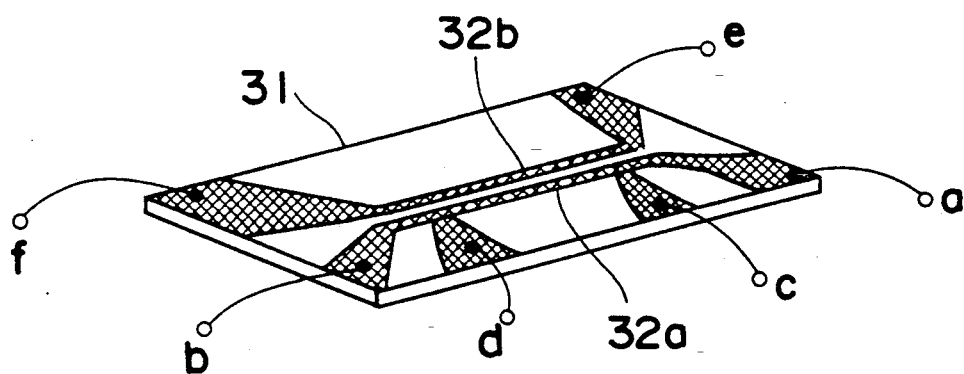
Figure 12C:
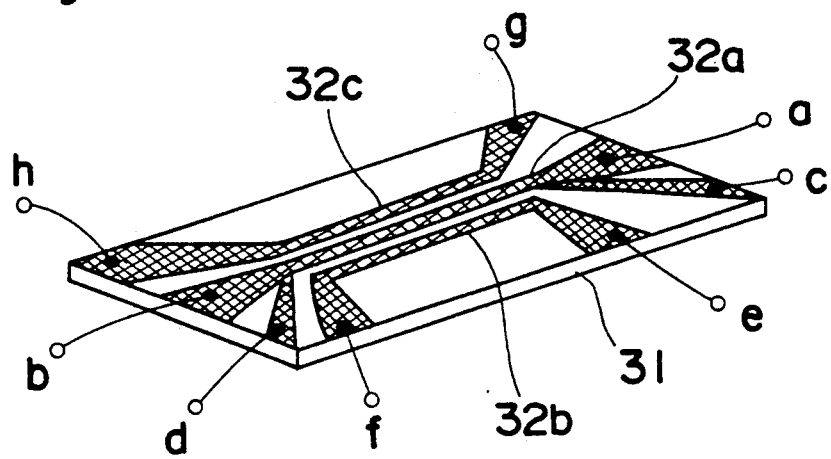
FIG. 12(c) is a perspective view showing another superconductive body formed on a substrate according to the first preferred embodiment of the present invention.

FIGS. 12(a) and 12(b) or 12(c) show an example wherein linear conductors are formed by patterning a ceramic superconductive film 32. The ceramic superconductive film 32 itself is formed according to the same method as stated above. The film 32 formed on a substrate 31, as shown in FIG. 12(a), is patterned by a suitable etching method, as shown in FIG. 12(b) or FIG. 12(c).

In the pattern shown in FIG. 12(b), two linear patterns 32a and 32b extending in parallel with each other are formed electrically separated.

The linear portion of the pattern 32a is used as a superconductor for the magnetic sensor and the linear portion of the pattern 32b is used as a linear conductor. The former pattern 32a has two current electrodes a and b and also two voltage electrodes c and d drawn out to respective sides of the substrate 31 and the latter pattern 32b has two electrodes e and f drawn out to respective corners of the substrate 31 for applying a control current to the linear conductor.

The structure given by this pattern is essentially same to that shown in FIG. 1. Accordingly, if the pattern is formed so as to have same dimensions as those of the latter, the same result can be obtained.

The pattern shown in FIG. 12(c) is essentially same to the structure of the superconductive logic device shown in FIG. 6. Namely, the pattern has first and second linear conductors 32b and 32c extending in parallel with a magnetic sensor 32a.

Accordingly, the superconductive logic device operates as AND and EXCLUSIVE OR logic devices by controlling currents $I_1$ and $I_2$ as follows:

If the currents $I_1$ and $I_2$ satisfy the following conditions;

$$I_1 < I_0, I_2 < I_0, I_1 + I_2 > I_0 \qquad (3)$$

wherein $I_0$ is a threshold current which gives the threshold magnetic field $H_0$ and, if both of the currents $I_1$ and $I_2$ are applied to the first and second conductors 32b and 32c from the same direction, the magnetic sensor 32a outputs an AND logic output between the electrodes c and d as explained regarding FIGS. 6 and 7.

The superconductive logic device behaves as an exclusive OR logic device provided that the currents $I_1$ and $I_2$ satisfy the following conditions and that the directions of application of the currents $I_1$ and $I_2$ are opposite with each other.

$$I_1 > I_0, I_2 > I_0, |I_1 - I_2| < I_0 \qquad (4)$$

In this case, it outputs an output voltage only when either of the currents $I_1$ and $I_2$ is applied to either of the first and second conductors 32b and 32c.

If the directions of application of the currents $I_1$ and $I_2$ satisfying the conditions are the same, it behaves as an OR logic device.

In the present preferred embodiment, portions of the film among the first and second conductors 32b and 32c and the magnetic sensor 32a are removed by etching in order to separate (insulate) them with each other electrically. However, electrical separation of them can be attained by changing the electrical property of those portions from a conducting one to an insulating one.

As a method for changing the property, ions of As are implanted into portions of the film to be changed after covering the film with a metal mask having a pattern as shown in FIG. 12(b) or 12(c).

According to this method, a crystal structure of the ceramic superconductor is damaged by implanting As ions and is supposed to be changed into a non-crystal structure. The superconductive logic device manufactured using this method shows the same property as of the superconductive logic device manufactured using the etching technique.

The method for forming portions electrically separated is not limited to the above. The mechanically removing method (such as the sand blast method), the photoetching method, the reforming method using diffusion of different elements or the like is applicable therefor.

It is to be noted that the ceramic superconductor to be used in the present invention is not limited to $Y_1Ba_2Cu_3O_{7-x}$ provided that it has random grain boundaries therein.

SECOND PREFERRED EMBODIMENT

Figure 13:
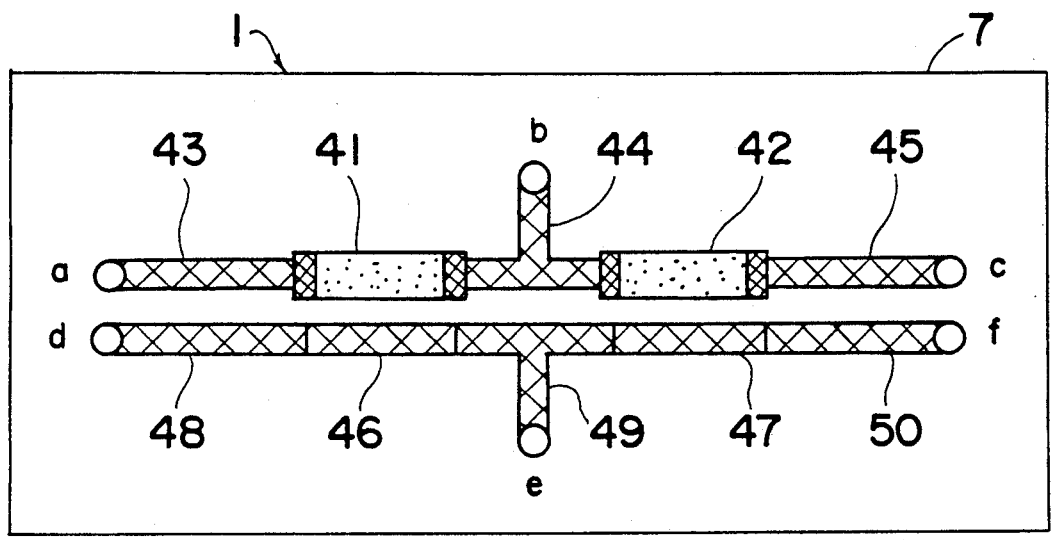
FIG. 13 is a plan view of a superconductive logic device according to a second preferred embodiment of the present application.

FIG. 13 shows a superconductive logic device 1 according to the second preferred embodiment of the present invention.

In the present preferred embodiment, a first and second linear ceramic superconductors 41 and 42 are formed in a lengthwise direction of a substrate 7 in series. Further, a first and second control lines 46 and 47 are formed on the substrate 7 in series with each other and in parallel with the first and second superconductors 41 and 42, respectively.

Respective outer ends of the first and second superconductors are connected to lead lines 43 and 45 forming terminals a and c at respective outer ends. Respective inner ends of them are connected by a lead line 44 of an inversed T-shaped which forms a terminal b at its free end.

Similarly, respective outer ends of the first and second control lines 46 and 47 are connected to lead lines 48 and 50 forming terminals d and f at respective free ends and a lead line 49 of a T-shape forming a terminal e at its lower end connects between them.

Figure 14:
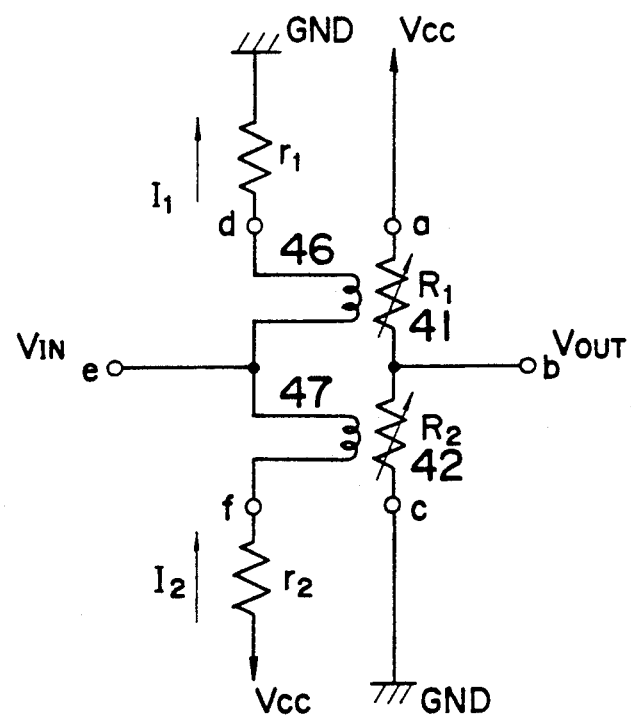
FIG. 14 is a view of a logic circuit using the superconductive logic device shown in FIG. 13.

FIG. 14 shows an inverter logic circuit using the superconductive logic device 1 shown in FIG. 13. In FIG. 14, the first and second superconductor 41 and 42 are represented by variable resistance $R_1$ and $R_2$, respectively and the first and second control lines 46 and 47 are represented by magnetic coils, respectively.

The terminal a is connected to a voltage supply source of a standard voltage Vcc and the terminal c is connected to the ground GND. The terminals d and f are connected, via resistances $r_1$ and $r_2$, to the ground GND and the voltage supply source, respectively.

An input voltage $V_{IN}$ is applied to the terminal e and an output voltage $V_{OUT}$ is taken out at the terminal b of a first inverter logic circuit and terminals of a second inverter logic circuit are connected in series between $V_{OUT}$ and GND.

Figure 15A:
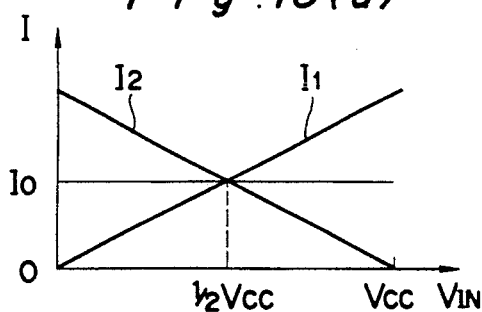
FIGS. 15(a), 15(b), 15(c) and 15(d) are graphs for showing a relation among quantities used in the circuit shown in FIG. 14.

In this composition, when the input voltage $V_{IN}$ is varied from zero to Vcc, a current $I_2$ flowing through the second control line 47 decreases linearly and, in contrast, a current $I_1$ flowing through the first control line 46 increases linearly, as shown in FIG. 15(a).

Figure 15B:
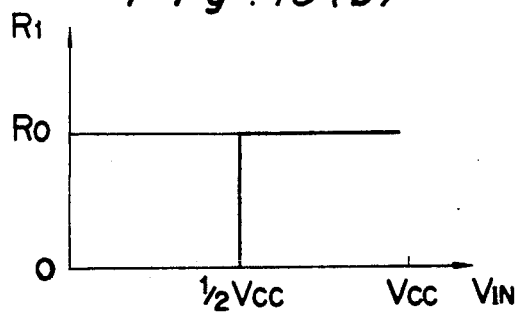
Figure 15C:
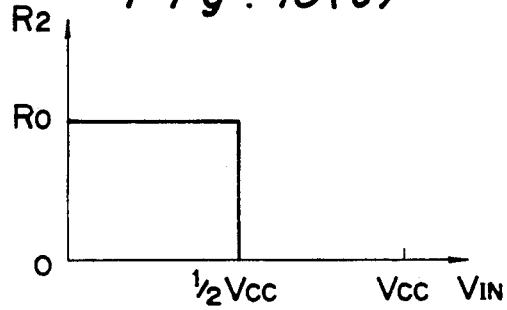
Figure 15D:
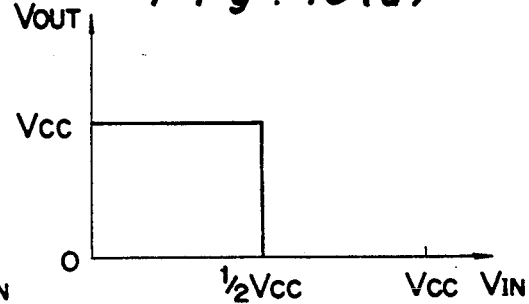

Assuming that the resistances $r_1$ and $r_2$ are equal with each other and that each of the first and second superconductors 41 and 42 shows a constant resistance $R_0$ when each of the currents $I_1$ and $I_2$ is equal to or larger than $I_0$ which is obtained at the $V_{IN}=\frac{1}{2}$Vcc, resistances $R_1$ and $R_2$ ($R_1=R_2=R_0$) are generated in the first and second superconductors 41 and 42 according to the variation of the input voltage $V_{IN}$ as shown in FIGS. 15(b) and 15(c) respectively. Accordingly, the output voltage $V_{OUT}$ being equal to Vcc is outputted at the terminal b until the input voltage $V_{IN}$ increases from zero to ($\frac{1}{2}$Vcc), as shown in FIG. 15(d), and it drops down to zero as soon as $V_{IN}$ exceeds ($\frac{1}{2}$Vcc). Thus, an inverter logic output is obtained.

Figure 16:
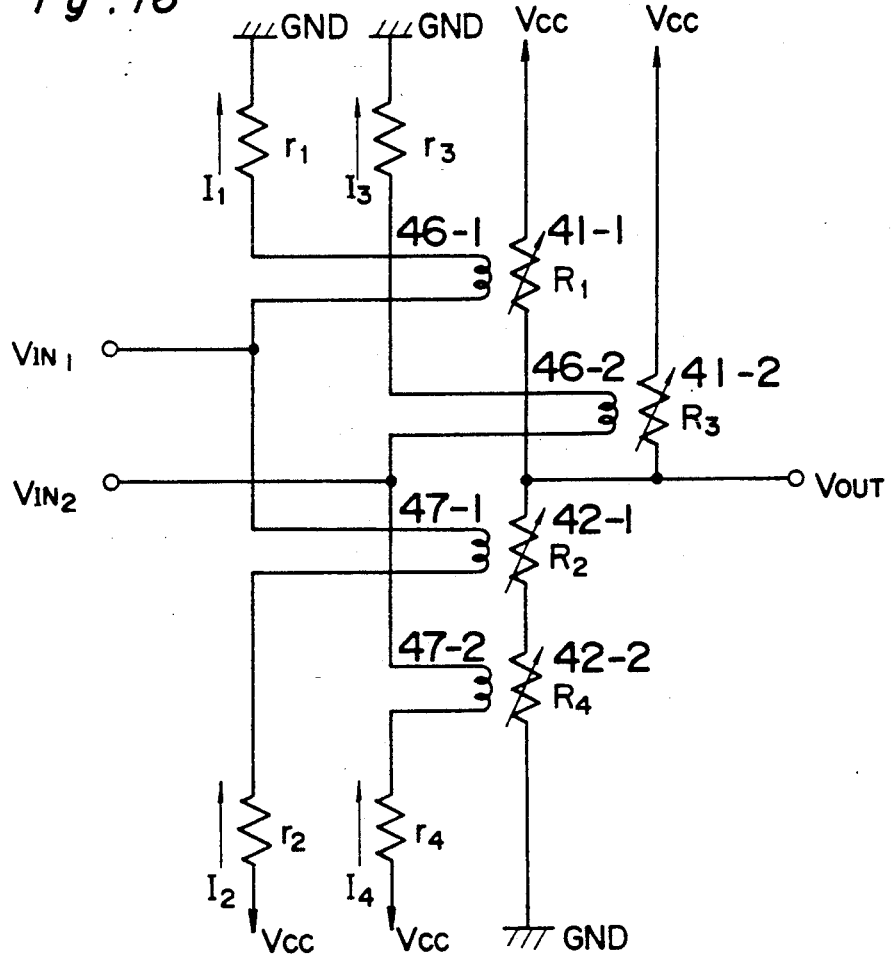
FIG. 16 is a circuit showing a superconductive logic circuit using a pair of the superconductive logic devices each of which is shown in FIG. 14.

FIG. 16 shows a NAND logic circuit comprised of two inverter logic circuits each of which is shown in FIG. 14.

In this NAND logic circuit, the first and second superconductors 41-1 and 41-2 of the first inverter circuit are connected in parallel between Vcc and $V_{OUT}$, the first and second superconductors 42-1 and 42-2 of the second inverter circuit are connected in series between $V_{OUT}$ and the ground GND and output terminals of two inverter logic circuits are connected with each other so as to output an output voltage $V_{OUT}$ and input voltages $V_{IN1}$ and $V_{IN2}$ are input to input terminals of them, respectively.

Figure 17A:
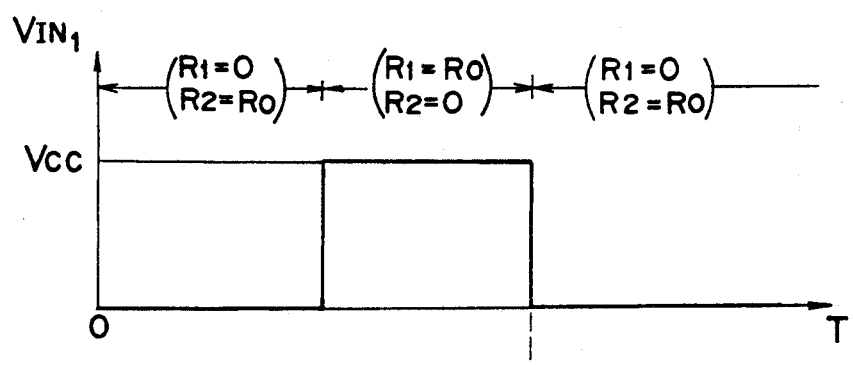
FIGS. 17(a) 17(b) and 17(c) are time charts for showing the function of the circuit shown in FIG. 16.
Figure 17B:
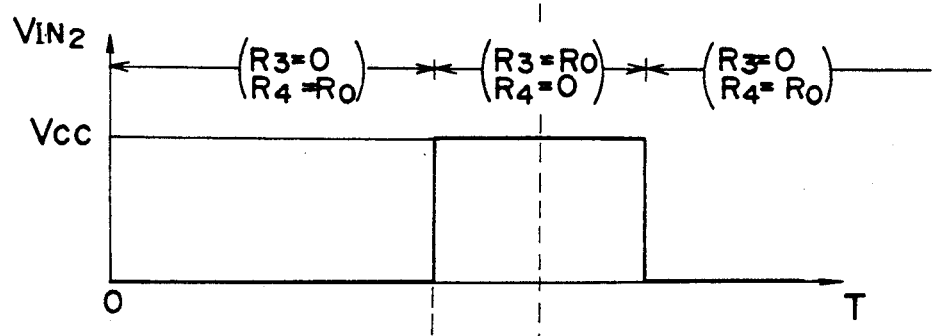
Figure 17C:
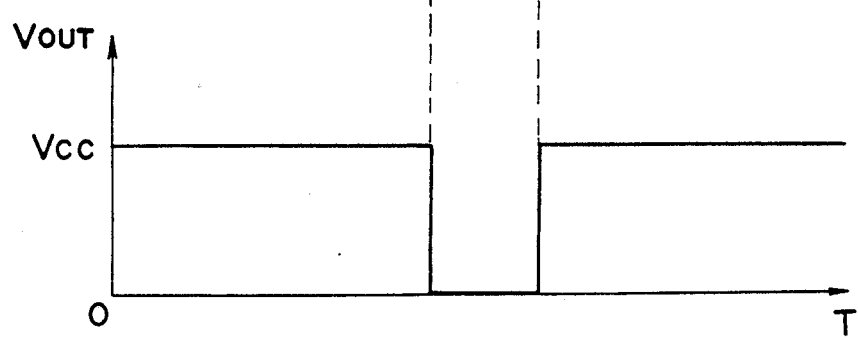

Assuming that $r_1=r_2=r_3=r_4=r_0$, $I_0=V_{cc}/2r_0$, and that $V_{IN1}$ and $V_{IN2}$ are varied as shown in FIGS. 17(a) and 17(b), respectively, the output voltage $V_{OUT}$ is varied as shown in FIG. 17(c). Namely, the output voltage $V_{OUT}$ drops down to zero level only when both of $V_{IN1}$ and $V_{IN2}$ are high and, thus, a NAND logic output is obtained.

Figure 18:
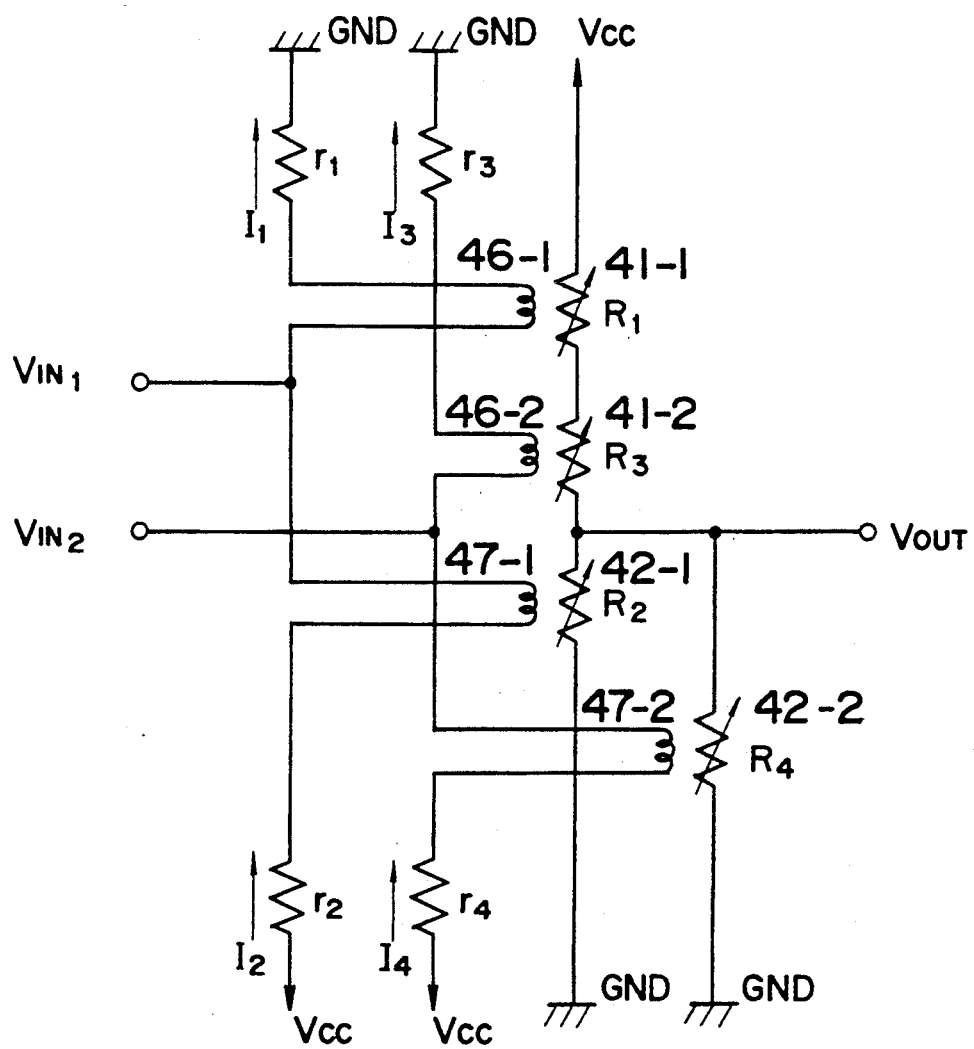
FIG. 18 is another circuit showing a superconductive logic circuit using a pair of the superconductive logic devices each of which is shown in FIG. 14.

FIG. 18 shows a NOR logic circuit obtained by changing connection relations of the NAND logic circuit shown in FIG. 16.

Figure 19A:
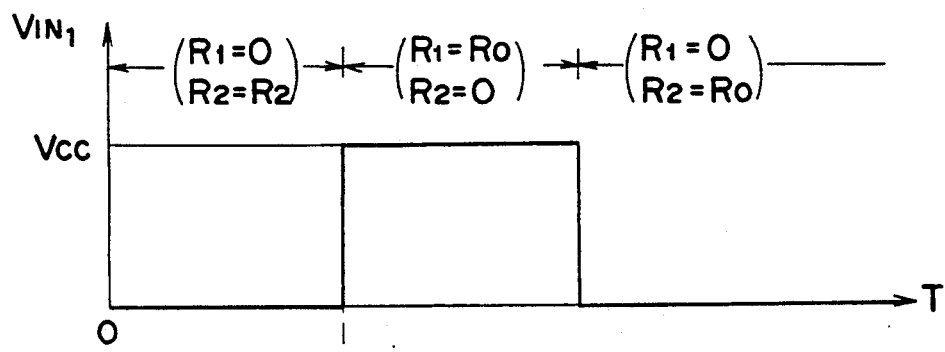
FIGS. 19(a), 19(b) and 19(c) are time charts for showing the function of the circuit shown in FIG. 18.
Figure 19B:
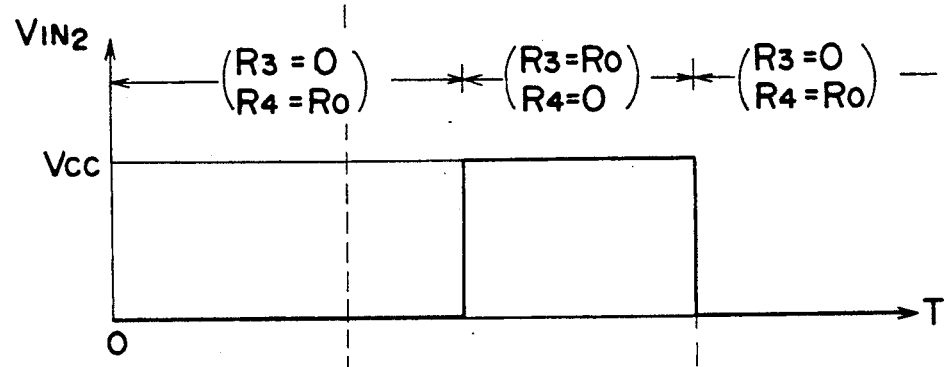
Figure 19C:
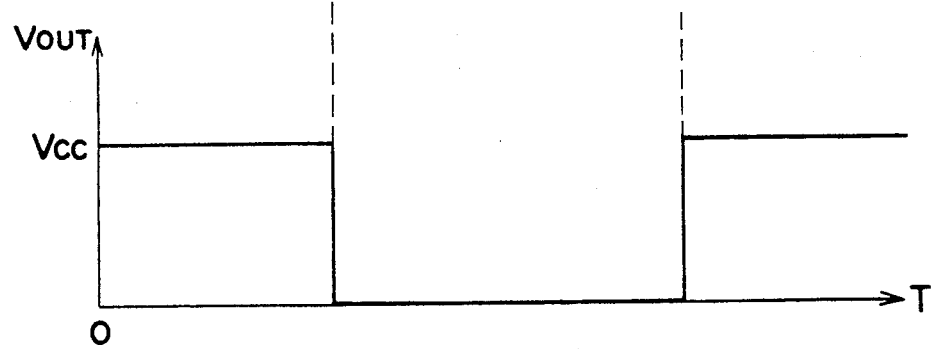

As is apparent from comparison of FIG. 16 with FIG. 18, the first and second superconductors 41-1 and 41-2 of the first inverter circuit are connected in series between Vcc and $V_{OUT}$ and those 42-1 and 42-2 of the second inverter circuit are connected in parallel between $V_{OUT}$ and GND in the former. In this case, as shown in FIG. 19(c), $V_{OUT}$ drops down to zero during application of $V_{IN1}$ and $V_{IN2}$ of a high level as shown in FIG. 19(a) or 19(b). Thus, a NOR logic output is obtained.

In the present preferred embodiment, a desired NAND or NOR logic signal can be obtained even if the superconductors have the resistance $R_0$ simultaneously in the case that the threshold current $I_0$ becomes lower than Vcc/$2r_0$.

According to the present preferred embodiment, there is provided a complementary type superconductive logic circuit wherein a desired logic output $V_{OUT}$ can be obtained in accordance with values of the input currents $V_{IN1}$ and $V_{IN2}$ with the use of a stabilized voltage power supply.

Third preferred embodiment

Figure 20:
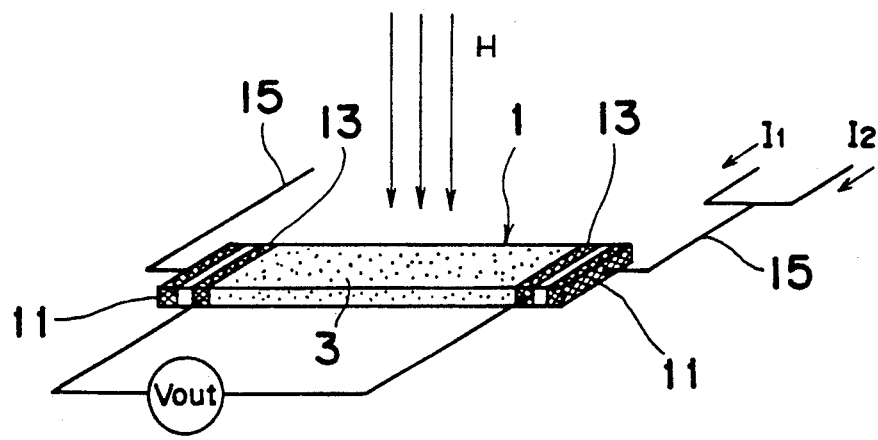
FIG. 20 is a schematic perspective view of a superconductive logic device according to a third preferred embodiment of the present invention.

FIG. 20 shows an AND logic device 1 using an elongated thin superconductor 3. A pair of current electrodes 11 and 11 and a pair of voltage electrodes 13 and 13 are formed on respective end portions of the superconductor 3. Two current feeding means (not shown explicitly) for feeding currents $I_1$ and $I_2$ is connected to either one of lead lines 15 and 15 connecting respective current electrodes 11 and 11. A constant magnetic field H is applied to the superconductor 3 vertically thereto.

Figure 21:
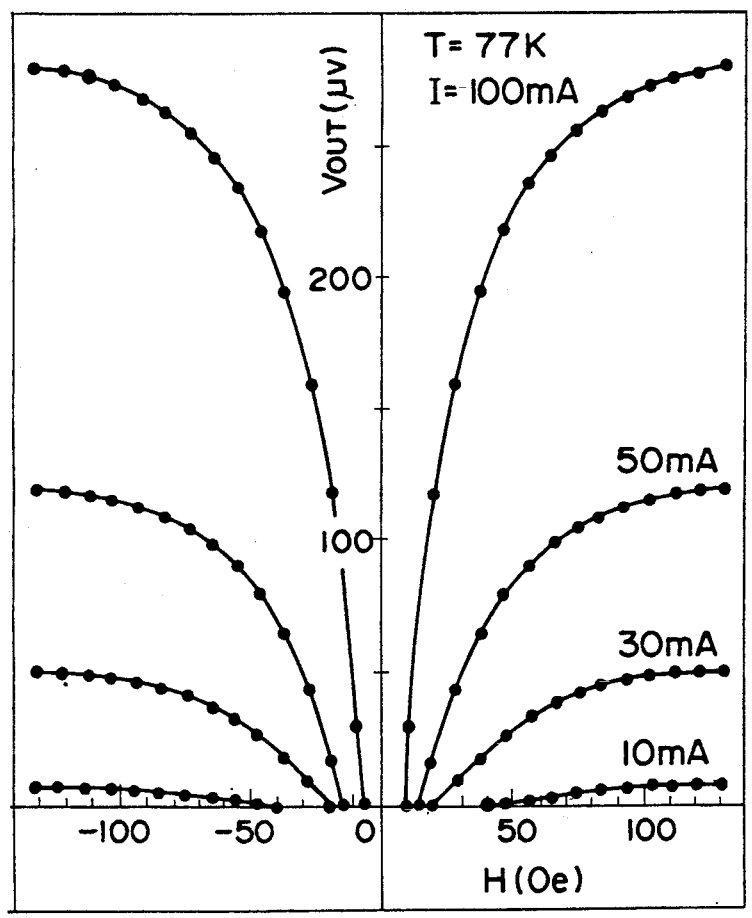
FIG. 21 is a graph showing a magneto-resistive property of the superconductive body shown in FIG. 20.
Figure 22:
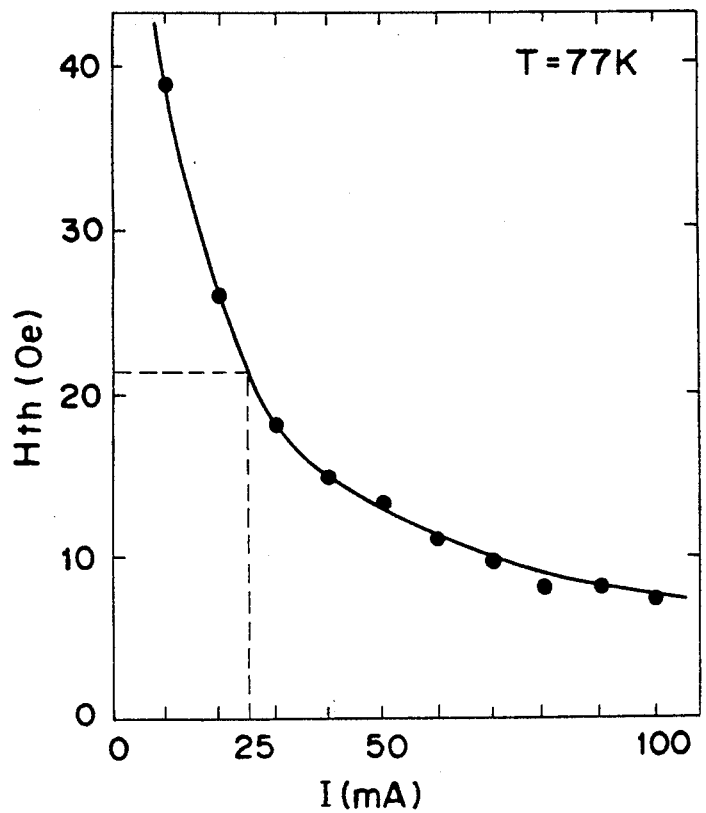
FIG. 22 is a graph showing a relation between a threshold magnetic field to the superconductive body and a current applied thereto.

FIG. 21 shows a magneto-resistive property of the superconductor 3 and FIG. 22 shows a relation between a threshold value Hth of the magnetic field to be applied to the superconductor 3 and a current to be fed thereto.

When only $I_1$ of 23 mAs is applied to the superconductor 3 while applying the constant magnetic field H of 20 Oes thereto, no output voltage $V_{OUT}$ is outputted as is apparent from FIG. 22.

Figure 23:
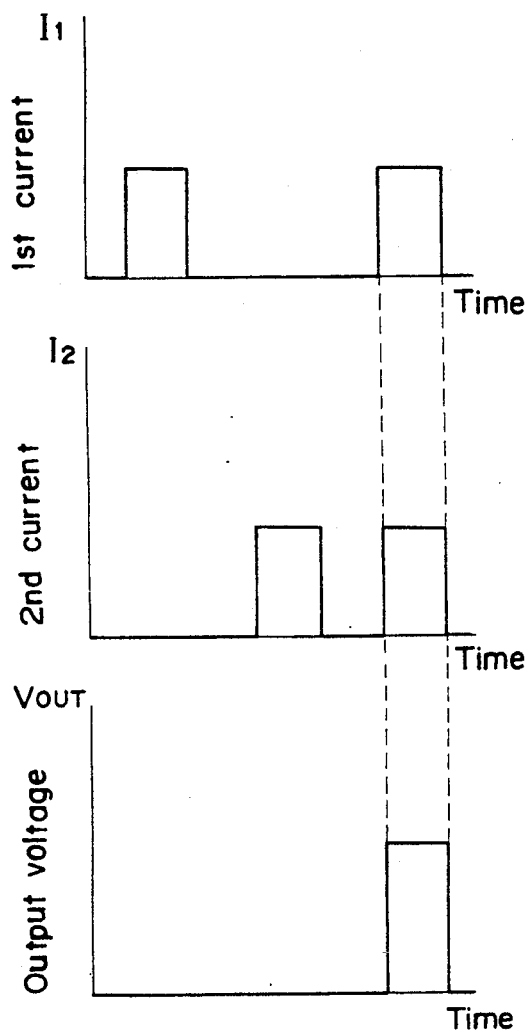
FIGS. 23 and 24 are time charts for showing respective functions of the superconductive logic device shown in FIG. 20 which are obtained according to manners of application of currents.

IF $I_2$ of 25 mAs is superposed to $I_1$ of 25 mAs, the total current I ($=I_1+I_2$) becomes 50 mAs and, therefore, the superconductor 3 has a resistance to generate an output voltage $V_{OUT}$ between two voltage electrodes 13 and 13 as shown in FIG. 23. Thus, the superconductive logic device 1 functions as an AND logic device.

Figure 24:
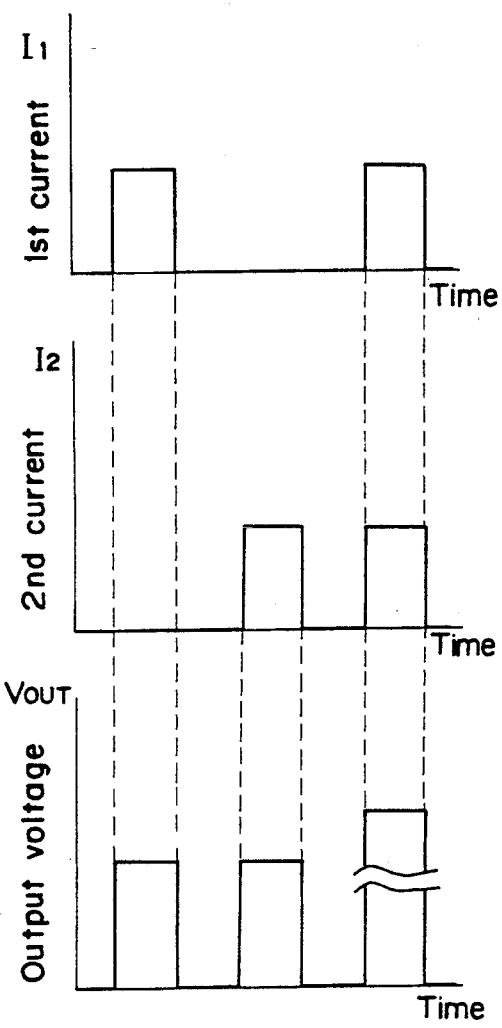

If the magnetic field H to be applied to the superconductor 3 is increased up to 30 Oes without changing strengths of the currents $I_1$ and $I_2$, the superconductive logic device functions as an OR logic device as shown in FIG. 24.

It is also possible to apply the magnetic field to the superconductive 3 using an electric magnet. In this case, the strength of the magnetic field can be controlled by controlling a current to be applied to the magnet. Accordingly, the logic device functions as both of AND and OR logic devices by changing the strength of the magnetic field.

Fourth preferred embodiment

Figure 25:
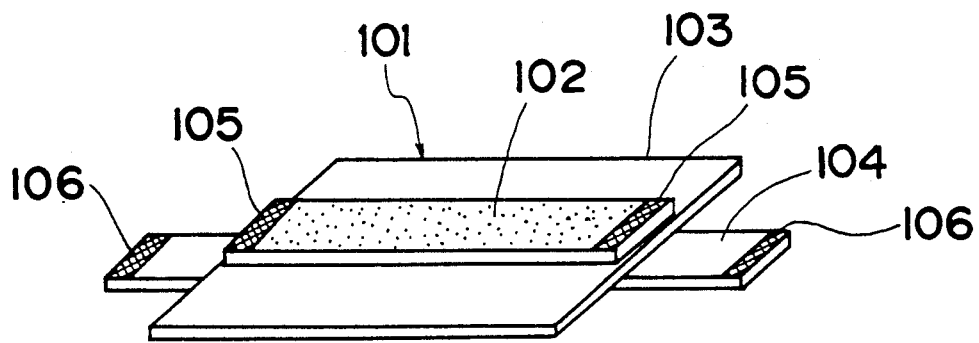
FIG. 25 is a perspective view of a superconductive logic device according to a fourth preferred embodiment of the present invention.

FIG. 25 shows a superconductive logic unit 101 according to the fourth preferred embodiment of the present invention.

An elongated thin superconductor 102 is formed on a surface of a substrate 103 along a lengthwise center line thereof. On the other surface of the substrate 103, a control line 104 of the same superconductive material as the superconductor 102 is formed in the lengthwise direction of the substrate 103. The substrate 103 can be made of a non-magnetic material such as stabilized zirconia, magnesia or the like. The superconductor 102 and the control line 104 are made using the same method as in the first preferred embodiment.

On respective end portions of the superconductor 102, current electrodes 105 and 105 for applying a current thereto and two electrodes 106 and 106 for applying a control current to the control line 104 in order to generate a magnetic field to be applied to the superconductor 102 are formed.

Figure 26:
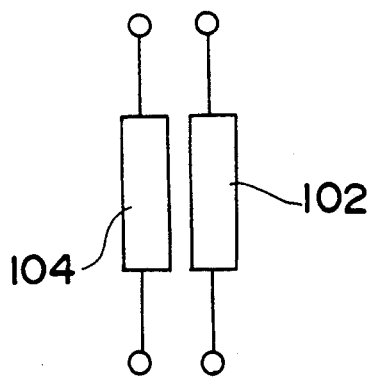
FIG. 26 is a symbolized circuit showing the superconductive logic device shown in FIG. 25.

The composition of the superconductive logic unit 101 is symbolized as shown in FIG. 26 for simplicity sake.

Figure 27A:
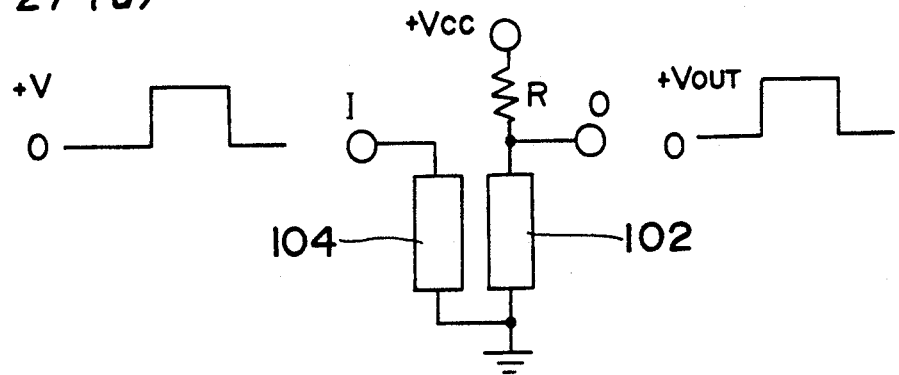
FIGS. 27(a) and 27(b) show examples of application of the circuit shown in FIG. 26, respectively.

FIG. 27(a) shows a fundamental logic circuit using the superconductive logic unit.

Figure 27B:
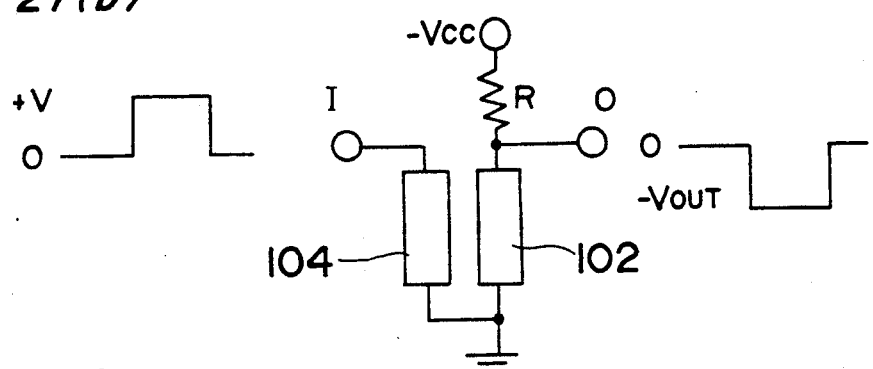

In this circuit, the superconductor 102 is connected between a reference voltage line of a positive voltage Vcc and the ground in series with a resistance R. One end of the control line 104 is connected to the ground and the other end thereof is used as an input terminal I for inputting a control signal. An output terminal O is drawn out from a portion between the superconductor 012 and the resistance R. When a signal current as shown on the left side portion of FIG. 27(a) is applied to the control line 104 from the input terminal I, a magnetic field generated by the control line 104 is applied to the superconductor 102. At that time, a resistance is induced in the superconductor 102 and, therefore, a positive voltage output $V_{OUT}$ is outputted from the output terminal O. If a negative voltage ($-Vcc$) is applied to the reference voltage line, a negative output voltage ($-V_{OUT}$) is outputted from the output terminal O as shown in FIG. 27(b).

Figure 28A:
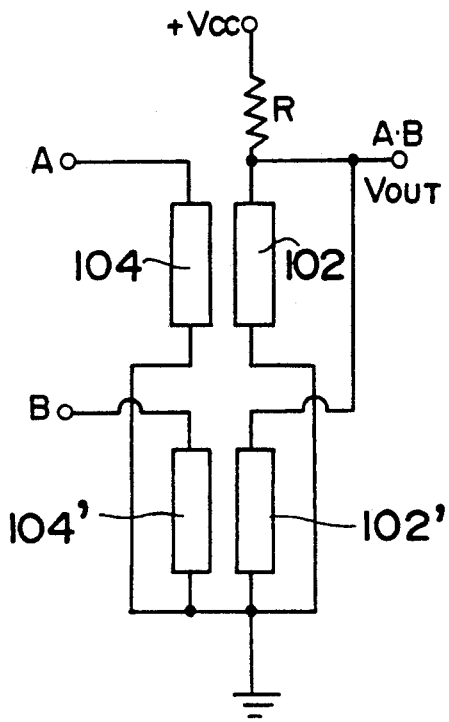
FIGS. 28(a) and 28(b) show examples of application using a pair of the circuits each shown in FIG. 26, respectively.

FIG. 28(a) shows an AND logic circuit using two superconductive logic units.

In this logic circuit, two control lines 104 and 104' are connected to input terminals A and B to which positive signal voltages are inputted, respectively and two superconductors 102 and 102' are connected in parallel between a resistance R connected to a standard power supply of a positive voltage ($+Vcc$) and the ground. A common output terminal A·B is drawn out from a portion between the resistance R and the superconductor 102 and from the other end of another superconductor 102'.

When a control signal is inputted only to either of the two input terminals A and B, no output voltage $V_{OUT}$ is generated at the output terminal A·B since no resistance is generated in either of the superconductors. Accordingly, only when two control signals are inputted to both of the two input terminals A and B simultaneously, an output voltage $V_{OUT}$ is outputted from the output terminals A·B. Thus, this logic circuit forms an AND logic circuit.

Figure 28B:
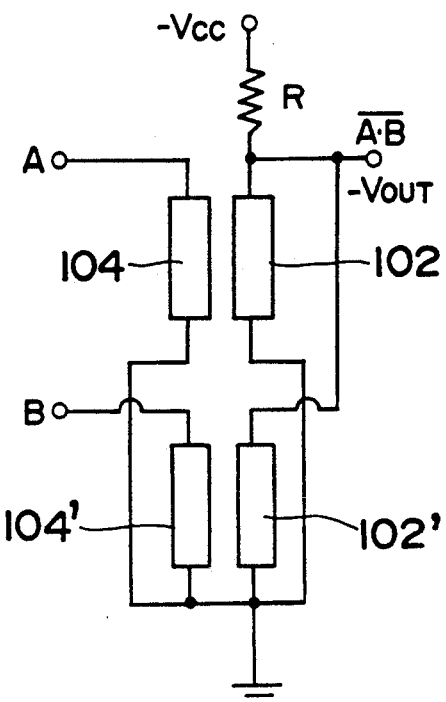

FIG. 28(b) shows a NAND circuit using two superconductive logic units.

In this circuit, the standard power supply feeds a negative standard voltage ($-Vcc$) while maintaining other connection relations same as those of FIG. 28(a). Thus, an inverted output voltage ($-V_{OUT}$) is generated at an output terminal $\overline{A·B}$ only when control signals are inputted to both of the input terminals A and B simultaneously.

Figure 29A:
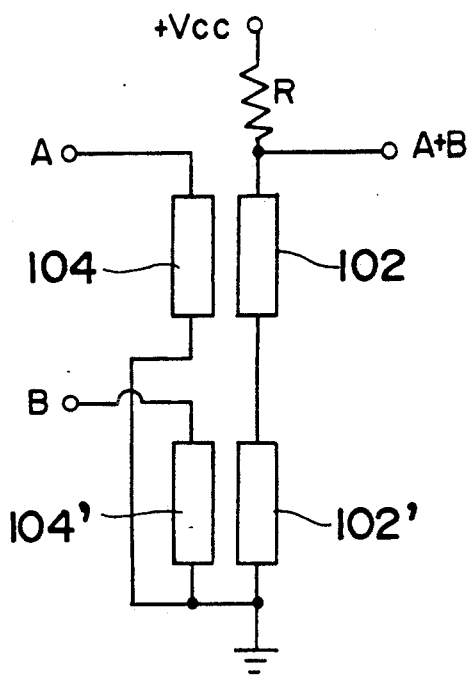
FIG. 29(a) and 29(b) show other examples of application using a pair of the circuit each shown in FIG. 26, respectively.

FIG. 29(a) shows an OR logic circuit using two superconductive logic circuits.

In this circuit, two superconductors 102 and 102' are connected in series, via a resistance, between a standard voltage supply of a positive voltage Vcc and the ground while respective control lines 104 and 104' are connected to respective input terminals A and B. An output terminal (A+B) is drawn out from a portion between the resistance R and the superconductor 102.

When a control signal is inputted to either of the input terminals A and B in this logic circuit, an output voltage $V_{OUT}$ is generated at the output terminal (A+B) since a resistance is generated in either of the superconductors 102 and 102'. Thus, this logic circuit forms an OR logic circuit.

Figure 29B:
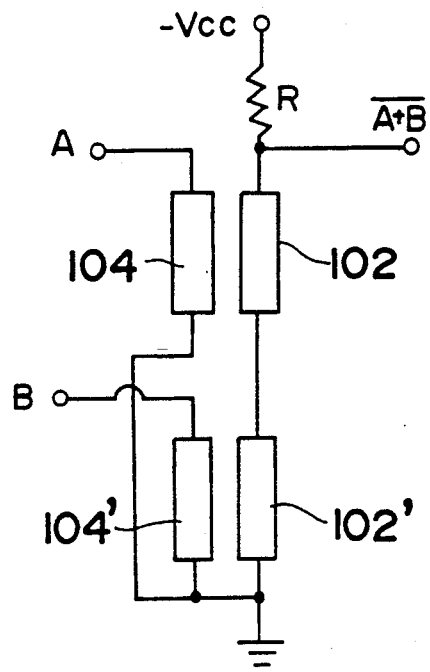

FIG. 29(b) shows a NOR logic circuit using two superconductive logic units. As is apparent from comparison of FIG. 29(b) with 29(a), the resistance R is connected to a standard voltage supply of a negative voltage ($-Vcc$) in this logic circuit and, therefore, an inverted OR output voltage ($-V_{OUT}$) is outputted at the output terminal $\overline{(A+B)}$.

Figure 30:
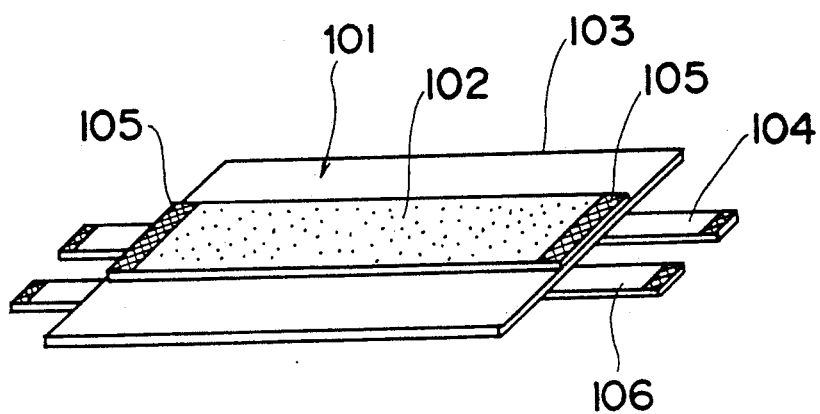
FIG. 30 is a perspective view showing another superconductive logic device according to the fourth preferred embodiment of the present invention.

In FIG. 30, there is shown a superconductive logic unit 101. The superconductive logic unit 101 has a control line 104 and a line 106 for generating a bias magnetic field. Lines 104 and 106 can be made of a ceramic superconductive material using the same forming method as of a superconductor 102 to be formed on another surface of a surface of a substrate 103. In this composition, a constant current is always applied to the line 106 to excert a bias magnetic field to the superconductive 102. The bias magnetic field $H_B$ is set so as to have a strength relatively close to but lower than the threshold magnetic field $H_C$. Due to this, the superconductor 102 and show a quick response to a control signal to be applied to the control line 104 even if the control signal is too weak to generate a resistance in the superconductor 102 only by itself.

Although the control line and/or the bias line are formed on the rear surface of the substrate in the third preferred embodiment, they can be formed together with the superconductor on the same surface of the substrate as stated in the forgoing preferred embodiment.

Fifth preferred embodiment

Figure 31:
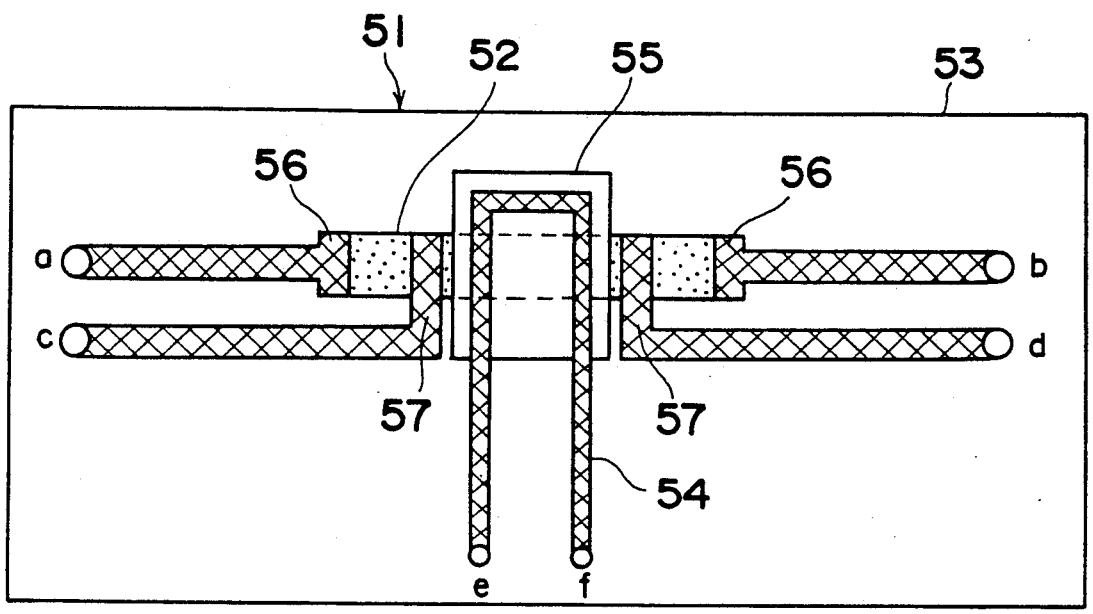
FIG. 31 is a plan view showing a superconductive logic device according to a fifth preferred embodiment of the present invention.

FIG. 31 shows a plan view of a superconductive logic device according to the fifth embodiment of the present invention.

This superconductive logic device 51 is comprised of a superconductor 52 formed on a substrate 53 and a control line 54 of an inverted U shape (when viewing FIG. 31 from a top view with legs e and f being closest to the viewer) which is formed on an insulation film 55 for insulating the superconductor 52 from the control line 54. The superconductor 52 has a pair of current electrodes 56 and 56 for applying a constant current and also a pair of voltage electrodes 57 and 57 for detecting an output voltage. If no current is supplied to the control line 54, no voltage is detected between terminals c and d. However, if a control current is applied to the control line 54, an output voltage $V_{OUT}$ is generated between terminals c and d since a resistance is generated in the superconductor 3 by a magnetic field generated by the control current.

In this composition, dimensions of the superconductor 52 are set same as those of the superconductor 3 shown in FIG. 1 and the width of the control line 54 is set at 30 $\mu$ms. In this case, if a control current of 5 mAs is applied to the control line 54 while applying a constant current of about 1 mA to the superconductor 52, an output voltage $V_{OUT}$ of about 20 $\mu$Vs is generated between terminals c and d.

In the case of FIG. 1, it is necessary to apply a constant current of about 10 mAs to the superconductor 9 in order to obtain an output voltage between terminals c and d. However, in the present case, the constant current can be decreased to 1 mA since the control line crosses twice over the superconductor 52 and, therefore, magnetic fields generated by respective portions of the control line 54 are applied concentratedly to the superconductor 52. Also, the strength of the control current is decreased to several mAs as stated above.

Figure 32:
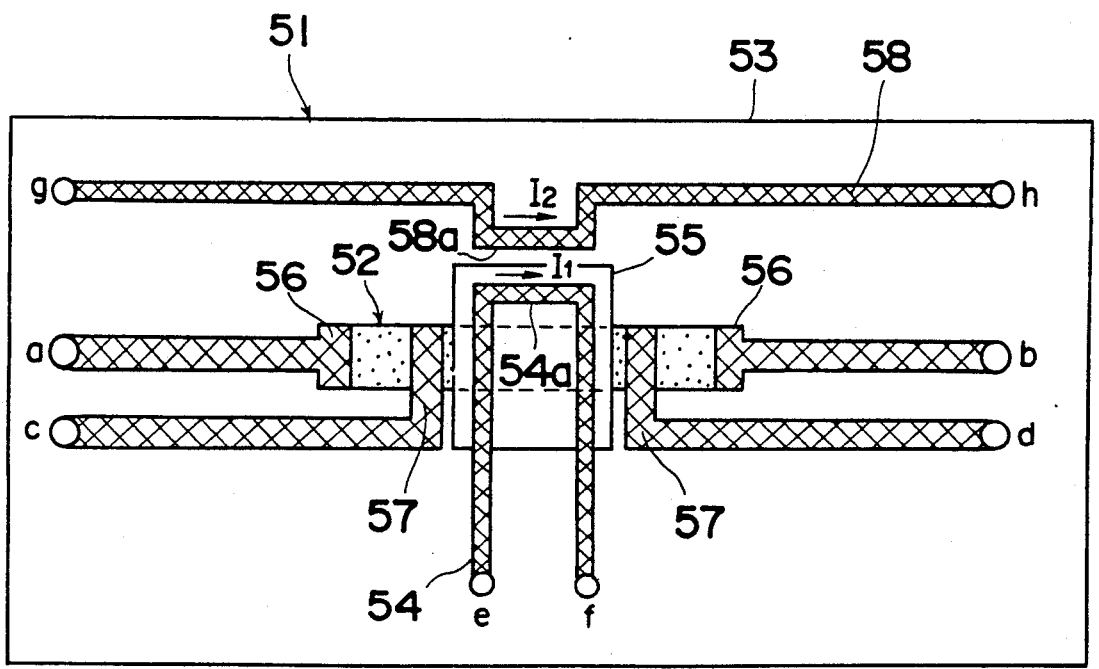
FIG. 32 is a plan view showing another superconductive logic device according to the fifth preferred embodiment of the present invention.

In an example of FIG. 32, one more control line 58 having terminals g and h is formed on the substrate 53 substantially in parallel with the superconductor 52. As shown in FIG. 32, the middle portion 58a of the control line 58 is formed close to portion 54a of the control line 54 parallel to the superconductor 52. A distance between respective centers of the portions 58a and 54a is set at 50 $\mu$ms. The widths of two control lines and the superconductor 52 are set at 30 $\mu$ms, 30 $\mu$ms and 50 $\mu$ms, respectively.

It is assumed that current $I_1$ and $I_2$ are set so as to satisfy the following conditions:

$$H_1 < H_0, H_2 < H_0, H_1 + H_2 > H_0$$

wherein $H_0$ is a threshold magnetic field from which a resistance is generated in the superconductor 52 when a predetermined current is applied thereto and $H_1$ and $H_2$ are magnetic fields applied thereto by respective currents $I_1$ and $I_2$. Under these conditions, no output voltage is detected between terminals c and d when either of the currents $I_1$ and $I_2$ is applied to either of the two control lines 54 and 58. However, an output voltage $V_{OUT}$ is generated between terminals c and d only when both of the currents $I_1$ and $I_2$ applied in the same direction as indicated by arrows. For example, if the currents $I_1$ and $I_2$ are set at 3 mAs and 15 mAs, respectively, an output voltage $V_{OUT}$ of about 20 $\mu$Vs is obtained. Thus, an AND logic circuit is obtained.

The composition of this logic circuit is essentially same to that of the logic circuit shown in FIG. 6. However, it is to be noted that, according to the present preferred embodiment, an output voltage $V_{OUT}$ having a same height as that of the logic circuit shown in FIG. 6 is obtained with weaker currents than those of the latter.

Figure 33:
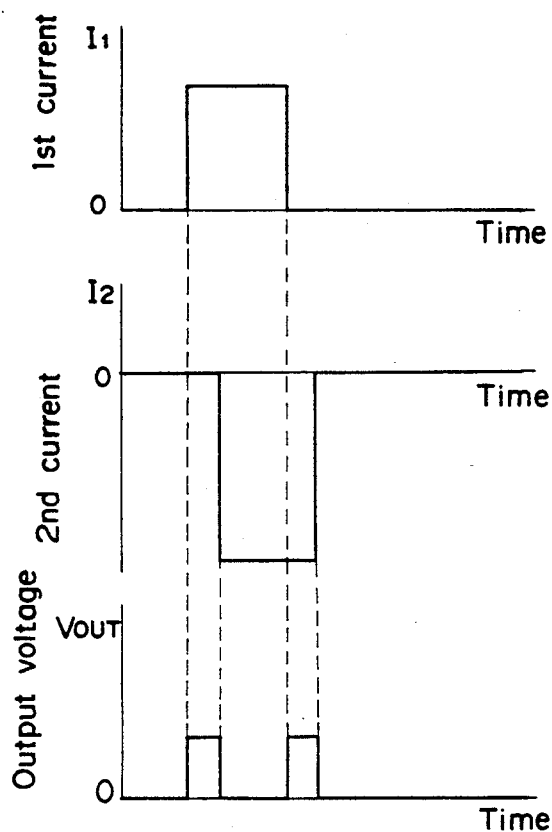
FIG. 33 is a time chart showing a function obtained by the superconductive logic circuit shown in FIG. 32.

If the currents $I_1$ and $I_2$ satisfying the following conditions;

$$H_1 > H_0, H_2 > H_0, |H_1 - H_2| < H_0$$

the superconductive logic device functions as an OR logic circuit. Namely, if only one current $I_1$ or $I_2$ is applied to the corresponding control line, an output voltage $V_{OUT}$ is generated between terminals c and d. However, if both of the currents $I_1$ and $I_2$ are applied to both of the control lines 54 and 58 simultaneously but in opposite directions to each other, no output voltage $V_{OUT}$ is detected, as shown in FIG. 33.

Figure 34:
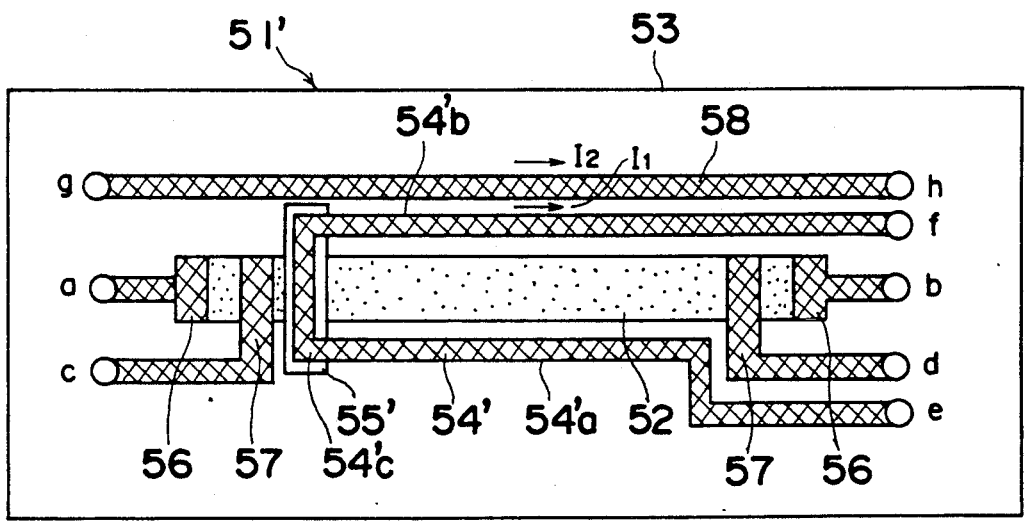
FIG. 34 is a plan view showing a variation of the superconductive logic device shown in FIG. 32.

FIG. 34 shows a variation of the superconductive logic circuit shown in FIG. 32.

In this variation, a first control line 54' is formed in a U-shape having two parallel portions 54'a and 54'b extending in parallel with the elongated superconductor 52 and a connection portion 54'c is formed on an insulation film 55' crossing over the superconductor 52. A second control line 58 is formed in parallel with the portion 54'b of the first control line 54'.

Since the essential structure of the superconductive logic circuit is identical with that of the logic circuit shown in FIG. 32, it functions as both of AND and OR circuits by controlling strengths of the currents $I_1$ and $I_2$ and directions of them.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A logic circuit comprising:
    a film superconductive body made of a ceramic superconductive material which has a critical temperature and grain boundaries which act as weak couplings, said superconductive body capable of passing from a resistance state of zero to a finite resistance state said film conductor body being connectable to a power supply for applying a constant current to said film superconductive body, said film superconductive body showing a magneto-resistive property in accordance with a magnetic film applied thereto while keeping the film superconductive body at a temperature near to the critical temperature thereof;
    a first film conductor for applying a magnetic field to said superconductive body when a signal current is applied to said first conductor, said film superconductive body functioning to generate an output voltage in responses to the signal current applied to the first film conductor;
    a second film conductor for applying a magnetic field to said superconductive body when a signal current is applied to said second film conductor, said film superconductive body functioning to generate an output voltage in responses to the signal current applied to the second film conductor;
    said film superconductive body and each of said film conductors formed on a substrate and said film superconductor body and said film conductors being substantially parallel to each other and spaced from each other in a lateral direction on one surface of said substrate; and
    voltage detector electrodes electrically connected and physically extending across said film superconductive body, said voltage detector electrodes for facilitating sensing a voltage drop across said superconductive body;
    the grain boundaries of said superconductive material causing the voltage drop across said superconductive material causing the voltage drop across said superconductive material to vary corresponding to varying signal currents applied to said first and second conductor films.

2. A logic circuit as claimed in claim 1, wherein said superconductive body and said first and second film conductors are formed on a substrate made of an insulation material.

3. A logic circuit as claimed in claim 2 wherein said superconductive body is a thin film of a ceramic superconductive material formed on said substrate.

4. A logic circuit as claimed in claim 1 wherein said superconductive body is formed by an elongated thin film.

5. A unit for a logic circuit as claimed in claim 1 wherein a constant current is applied to either one of said first and second film conductors and a signal current is applied to another one.

6. A unit for a logic circuit as claimed in claim 5, wherein said constant current is weaker than a threshold current which is defined as a current which generates a threshold magnetic field to the superconductive body.

7. A unit for a logic circuit as claimed in claim 6 wherein the constant current is also a signal current.

8. A unit for a logic circuit as claimed in claim 7 wherein said currents to be applied to said first and second conductor means satisfy the following conditions;

$$I_1 < I_0, I_2 < I_0 \text{ and } I_1 + I_2 > I_0$$

wherein $I_1$ and $I_2$ are the signal currents and $I_0$ is a threshold current which generates a threshold magnetic field to said superconductive body.

9. A unit for a logic circuit as claimed in claim 7 wherein said currents satisfy the following conditions;

$$I_1 > I_0, I_2 > I_0 \text{ and } |I_1 - I_2| < I_0$$

wherein $I_1$ and $I_2$ are the signal currents and $I_0$ is a threshold current which generates a threshold magnetic field to said superconductive body.

10. A logic circuit comprising:
a film formed of a superconductive body made of a ceramic superconductive material which has a critical temperature and grain boundaries which act as weak couplings, said superconductive body capable of passing from a resistance state of zero to a finite resistance state;
said film superconductive body being formed of two separate portions on an insulated substrate connected in series with a lead located at each end of said body and a single lead located between and in contact with said portions, said superconductive body showing a magneto resistive property in accordance with a magnetic field applied thereto while keeping the superconductive body at a temperature near to the critical temperature thereof;
a film conductor for applying a magnetic field to said superconductor body when a signal current si applied to said film conductor, said superconductive body functioning to generate an output voltage in response to said signal current;
said film superconductive body with its two separate portions and leads forming an inverter circuit.

11. The logic circuit as claimed in claim 1, wherein the voltage detector electrodes have a first and second portion, the first portion extending across the superconductor body and said second portion being substantially at a right angle to said first portion and extending parallel to and spaced from said upper conductive body.

12. A logic circuit comprising:
a film formed of a superconductive body made of a ceramic superconductive material which has a critical temperature and grain boundaries which act as weak couplings, said superconductive body capable of passing from a resistance state of zero to a finite resistance state, said film superconductive body being connectable to a power supply for applying a constant current to said superconductive body, said superconductive body showing a magneto-resistive property in accordance with a magnetic field applied thereto while keeping the superconductive body at a temperature near to the critical temperature thereof;
at least one film conductor for applying a magnetic field to said film superconductive body when a signal current is applied to said at least one film conductor said film superconductive body functioning to generate an output voltage in response to said signal current;
said film superconductive body and said at least one film conductor formed on a substrate made of an insulation material and said film superconductive body and said at least one film conductor being substantially parallel to each other and spaced from each other in a lateral direction on one surface of said substrate; and
voltage detector electrodes electrically connected to and physically extending across said film superconductive body, said voltage detector electrodes for facilitating sensing a voltage drop across said film superconductive body;
the grain boundaries of said superconductive material causing the voltage drop across said superconductive material to vary corresponding to varying signal current applied to said film conductor means; and
wherein the voltage detector electrodes have a first and second portion, the first portion extending across the superconductive body and said second portion being substantially at a right angle to said first portion and extending parallel to and spaced from said superconductive body.

13. A logic circuit comprising:
a film superconductive body made of a ceramic superconductive material which has a critical temperature and grain boundaries which act as weak couplings;
said film superconductive body capable of passing from a resistant state of zero to a finite resistive state, said film superconductive body being connectable to a power source for applying a constant current to said film superconductor body said film superconductive body showing a magnetic resistive property in accordance with magnetic field applied thereto while keeping the film superconductive body at a critical temperature thereof;
a first film conductor for applying a magnetic filed to said film superconductive body when a signal current is applied to said film conductor, said film conductor being only a signal substantially "U" shaped member completely crossing the film superconductive body, said film superconductor body and said first film conductor formed on an insulated substrate; and
voltage detector electrodes electrically connected to and physically extending across said film superconductor body, said voltage detector electrodes for facilitating sensing a voltage drop across said superconductor body;
the grain boundaries of said superconductor material causing the voltage to drop across said superconductor material corresponding to the varying signal currents applied to said first film conductor.

14. A logic circuit comprising:
a film superconductive body made of a ceramic superconductive material which has a critical temperature and grain boundaries which act as weak couplings, said superconductive body capable of passing from a resistance state of zero to a finite resistance state, said superconductive body being connectable to a power supply for applying a constant current to said film superconductive body, said superconductive body showing a magneto resistive property in accordance with a magnetic field applied thereto while keeping the film superconductive body at a temperature near to the critical temperature thereof;

there being only two film conductors for applying a magnetic field to said superconductive body when a signal current is applied to said to film conductors;

said film superconductive body functioning to generate an output voltage in response to the signal current applied to the film conductors;

the first of the film conductors being of U-shape and completely crossing the film superconductive body, the second film conductor being substantially linear except for a U-shape portion which is directly adjacent to said U-shaped film conductor, and voltage detector electrodes connected across said film superconductive body, said voltage detector electrodes for facilitating sensing a voltage drop across said superconductive body, the grain boundaries of the ceramic superconductor material causing the voltage drop across said superconductor material to vary corresponding to the varying signal currents applied to said first and second conductor films.

15. The logic device according to claim 14, wherein the U-shaped film is substantially perpendicular to the film superconductive body in the length direction of the film superconductive body.

16. A logic device comprising:

a film formed of a superconductive body made of a ceramic superconductive material which has a critical temperature and grain boundaries which act as weak couplings, said superconductive body capable of passing from a resistance state of zero to a finite resistance state, said superconductive body being connectable to a power supply for applying a constant current to said film superconductive body, said film superconductive body exhibiting a magneto resistive property when a magnetic filed is applied thereto while keeping the film superconductive body at a temperature near to the critical temperature thereof;

only a single first film conductor of substantially U-shape crossing said film superconductive body for applying a magnetic field to said film body when a signal current is applied to said U-shaped conductor, said film conductor body functioning to generate an output response to the signal current applied to the U-shaped film conductor, a substantially linear film conductor for applying a magnetic field to said superconductive body when a signal current is applied to said second film conductor said film superconductive body functioning to generate an output voltage in response to a signal current applied to the second film conductor;

said film superconductive body and each of said film conductors formed on a substrate; and voltage detector electrodes electrically connected to an extending across said film superconductive body said voltage detector electrodes for facilitating sensing a voltage drop across said superconductive body; and the grain boundaries of said superconductive material causing the voltage drop across said superconductive material to vary corresponding to a varying signal current supplied to said conductor films.

17. The logic device according to claim 16 wherein the U-shaped conductor has a first portion crossing said film superconductive body substantially perpendicular to the length of said film superconductive body and second portions which extend from said first portion in a substantially linear direction and spaced from edges of said film superconductive body; and the second film conductor being spaced from one of said second portions of said U-shaped film.

* * * * *